United States Patent
Kuan et al.

(10) Patent No.: US 8,409,921 B2
(45) Date of Patent: Apr. 2, 2013

(54) INTEGRATED CIRCUIT PACKAGE SYSTEM INCLUDING HONEYCOMB MOLDING

(75) Inventors: Heap Hoe Kuan, Singapore (SG); Hamid Eslampour, San Jose, CA (US); DaeSik Choi, Seoul (KR); Rui Huang, Singapore (SG); Taeg Ki Lim, Icheon (KR)

(73) Assignee: Stats Chippac Ltd., Singapore (SG)

( * ) Notice: Subject to any disclaimer, the term of this patent is extended or adjusted under 35 U.S.C. 154(b) by 267 days.

(21) Appl. No.: 12/834,176

(22) Filed: Jul. 12, 2010

(65) Prior Publication Data

US 2010/0279504 A1    Nov. 4, 2010

Related U.S. Application Data

(63) Continuation-in-part of application No. 12/789,456, filed on May 28, 2010, now Pat. No. 8,217,501, which is a continuation of application No. 11/306,854, filed on Jan. 12, 2006, now Pat. No. 7,737,539.

(51) Int. Cl.
*H01L 23/02* (2006.01)

(52) U.S. Cl. ........ 438/109; 438/110; 438/107; 257/686; 257/723; 257/734

(58) Field of Classification Search .................. 257/686, 257/734, 723; 438/107, 110, 109
See application file for complete search history.

(56) References Cited

U.S. PATENT DOCUMENTS

| | | | |
|---|---|---|---|
| 5,608,265 A | 3/1997 | Kitano et al. | |
| 6,180,881 B1 | 1/2001 | Isaak | |
| 6,455,928 B2 | 9/2002 | Corisis et al. | |
| 6,469,374 B1 | 10/2002 | Imoto | |
| 6,522,022 B2 | 2/2003 | Murayama | |
| 6,611,012 B2 | 8/2003 | Miyamoto et al. | |
| 6,700,783 B1 | 3/2004 | Liu et al. | |
| 6,710,455 B2 * | 3/2004 | Goller et al. | 257/777 |
| 6,740,964 B2 | 5/2004 | Sasaki | |
| 6,770,980 B2 | 8/2004 | Shibata | |
| 6,781,241 B2 | 8/2004 | Nishimura et al. | |
| 6,847,109 B2 | 1/2005 | Shim | |
| 6,936,922 B1 | 8/2005 | Park et al. | |
| 7,511,366 B2 * | 3/2009 | Huang et al. | 257/678 |
| 7,675,152 B2 * | 3/2010 | Gerber et al. | 257/686 |
| 2002/0066952 A1 * | 6/2002 | Taniguchi et al. | 257/698 |
| 2003/0006494 A1 | 1/2003 | Lee et al. | |
| 2004/0262732 A1 | 12/2004 | Noma et al. | |
| 2005/0023583 A1 * | 2/2005 | Bolken | 257/295 |
| 2005/0263869 A1 | 12/2005 | Tanaka et al. | |
| 2007/0148822 A1 | 6/2007 | Haba et al. | |

* cited by examiner

*Primary Examiner* — S. V. Clark
*Assistant Examiner* — Krista Soderholm
(74) *Attorney, Agent, or Firm* — Ishimaru & Associates LLP

(57) ABSTRACT

A method of manufacture of an integrated circuit package system includes: providing a substrate with a top surface; configuring the top surface to include electrical contacts and an integrated circuit; providing a structure over the substrate with only a honeycomb meshwork of posts contacting the top surface of the substrate; and depositing a material to prevent warpage of the substrate on the top surface of the substrate and over the integrated circuit, the material patterned to have discrete hollow conduits that expose the electrical contacts.

20 Claims, 13 Drawing Sheets

INTEGRATED CIRCUIT PACKAGE SYSTEM INCLUDING HONEYCOMB MOLDING

CROSS-REFERENCE TO RELATED APPLICATION(S)

This application is a Continuation in Part of U.S. patent application Ser. No. 12/789,456 filed May 28, 2010, which is a Continuation of U.S. patent application Ser. No. 11/306,854 filed Jan. 12, 2006, now U.S. Pat. No. 7,737,539 B2.

TECHNICAL FIELD

The present invention relates generally to an integrated circuit package system, and more particularly to an integrated circuit package system including honeycomb molding.

BACKGROUND ART

The use of wafers is a cost-effective way to concurrently fabricate many semiconductor chips. Each semiconductor chip may contain several million active and passive devices that make up the Integrated Circuit (IC) systems that are so prevalent in our world. The most familiar applications of IC systems are found in cell phones, camcorders, portable music players, televisions, and computers.

Once all the chips are fabricated and tested at the wafer level, the chips are separated from the wafer and assembled into final integrated circuit package systems. The assembly and package process takes Known Good Die (KGD), places them in a package, and interconnects the device bonding pads to the package leads. As customer demand improves chip performance, new requirements are placed on integrated circuit package. To meet this demand, the semiconductor industry had begun stacking individual chips and even packages one over the other in an effort to decrease size while increasing computing power.

While these stacked die packages have increased functional integration in ultra thin profiles, the lack of known good sub-assemblies in these stacked die packages necessitates the pre-testing of packaged three-dimensional configurations. As a result, stacking pre-tested packages together in a single configuration is emerging as an option. For example, these options include package-on-package (PoP) three-dimensional technology and package-in-package (PiP) three-dimensional technology. PoP is a three-dimensional package structure in which fully tested packages, such as, single die Fine Ball Grid Array (FBGA) or stacked die FBGA are stacked one on top of another single die or stacked die FBGA. PiP technology employs stacking a tested internal stacking module on top of a base assembly package to form a single chip scale package.

PoP and PiP three-dimensional technology is becoming popular due to their KGD aspect. However, one of the major disadvantages of this technology is that for the bottom package, only the area directly around the dies are molded, leaving the outer perimeter regions of the substrate exposed. These exposed outer perimeter substrate regions, which contain electrical connection sites and no molding compound, are subject to severe warpage after ball mount and reflow. The warpage of the bottom substrate arises due to the differences in thermal expansion between the semiconductor chip, the substrate, the solder balls and the molding compound. Most notably, after deposition of the molding compound, the over-contraction of the molding compound during cooling causes the substrate to warp.

Substrate warpage becomes an issue in stacked package design because of failed interconnects between a top and bottom package. Since substrate warpage causes the solder balls to be located out of plane, they make a poor electrical connection or fail to make an electrical connection at all with the target substrate. Such inconsistencies in stacked package configurations cause unacceptable package yields and unacceptable device failures upon integration into consumer products. Needless to say, such inconsistencies can also increase production costs.

Attempts have been made to combat the warpage of substrates. For instance, reinforcement layers have been affixed to the surfaces of substrates to provide structural support. Unfortunately, such measures require extra processing steps, which can increase the cost of production.

Other attempts to combat substrate warpage have incorporated a flexible adhesive agent between adjacent substrates or packages. Unfortunately, the adhesive agents add bulk to the overall chip design, and consequently, are contrary to the goals of semiconductor manufacturing of reducing package dimensions.

Finally, additional attempts at controlling substrate warpage include depositing an encapsulation layer and then lasing through the encapsulation layer to uncover the electrical circuitry. Regrettably, such attempts contend with damage caused by the laser and also require additional manufacturing steps, which increase the cost of production.

Thus, a need still remains for stacked package configurations that exhibit solid and consistent electrical connections between adjacent packages. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit package system including: providing a substrate with a top surface; configuring the top surface to include electrical contacts and an integrated circuit; providing a structure over the substrate with only a honeycomb meshwork of posts contacting the top surface of the substrate; and depositing a material to prevent warpage of the substrate on the top surface of the substrate and over the integrated circuit, the material patterned to have discrete hollow conduits that expose the electrical contacts.

The present invention provides a method of manufacture of an integrated circuit package system, including: providing a substrate with a top surface; configuring the top surface to include electrical contacts and an integrated circuit; providing a structure over the substrate with only a protruding block contacting the top surface of the substrate; and depositing a material to prevent warpage of the substrate on the top surface of the substrate and over the integrated circuit, the material patterned to have a block conduit that exposes the electrical contacts.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
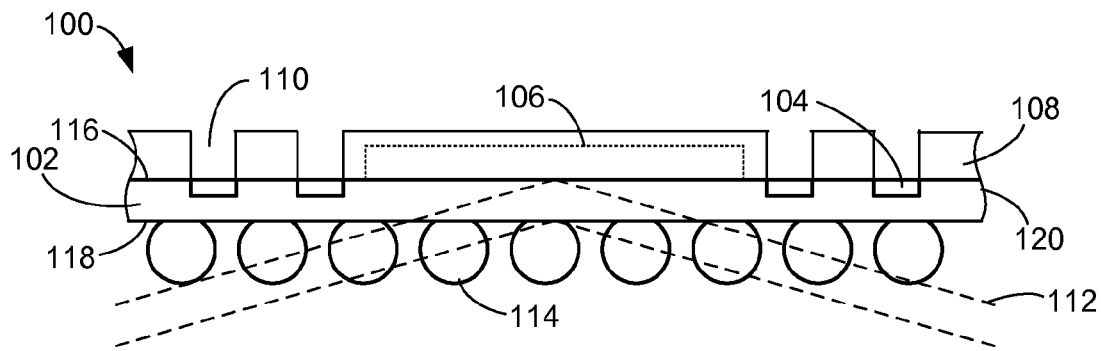
FIG. 1 is a section view of an integrated circuit package system after reflow in accordance with an embodiment of the present invention.

The following embodiments are described in sufficient detail to enable those skilled in the art to make and use the invention, and it is to be understood that other embodiments would be evident based on the present disclosure and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the invention are semi-diagrammatic and not to scale and, particularly, some of the dimensions are for the clarity of presentation and are shown exaggerated in the drawing FIGs. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "on" is defined as meaning there is direct contact between elements or components. The term "processing" as used herein includes deposition of material or photoresist, patterning, exposure, development, etching, cleaning, and/or removal of the material or photoresist as required in forming a described structure.

As mentioned above, device or package failure due to failed interconnections between adjacent substrates can reduce product yield and increase production costs. The present invention addresses this problem by providing a package system that prevents substrate warpage, and correspondingly, enhances the reliability of interconnections between adjacent substrates.

Referring now to FIG. 1, therein is shown a section view of an integrated circuit package system 100 after reflow in accordance with an embodiment of the present invention. FIG. 1 depicts the integrated circuit package system 100, such as a bottom package, including a substrate 102, electrical contacts 104, a semiconductor die 106, a material 108, discrete hollow conduits 110, such as, first discrete hollow conduits, or second discrete hollow conduits, dotted lines 112, external electrical connections 114, a top surface 116, a bottom surface 118, and a perimeter 120. The substrate 102 includes the electrical contacts 104. The material 108, formed over the substrate 102 and the semiconductor die 106, includes the discrete hollow conduits 110 formed over the electrical contacts 104. Most notably, FIG. 1 illustrates that the substrate 102 experiences little deflection from its original horizontal plane. The substrate 102 remains rigidly fixed within plane because of the structural support offered by the material 108.

The dotted lines 112 are representative of the characteristic downward warpage incurred by prior art bottom packages.

Prior art packages may also deflect upwards, as well as, in more than one direction. The warpage of prior art methods causes a deflection of the external electrical connections 114 out of the original horizontal plane of the substrate 102. Such deflections of the external electrical connections 114 affects their attachment to objects, such as, for example, a printed circuit board. The deflection of the external electrical connections 114 can cause failed or weakened interconnects, which will diminish product yield.

Referring now to FIGS. 2 through 5, therein are shown different mold systems for forming the discrete hollow conduits 110, of FIG. 1, within the material 108, of FIG. 1.

Figure 2:
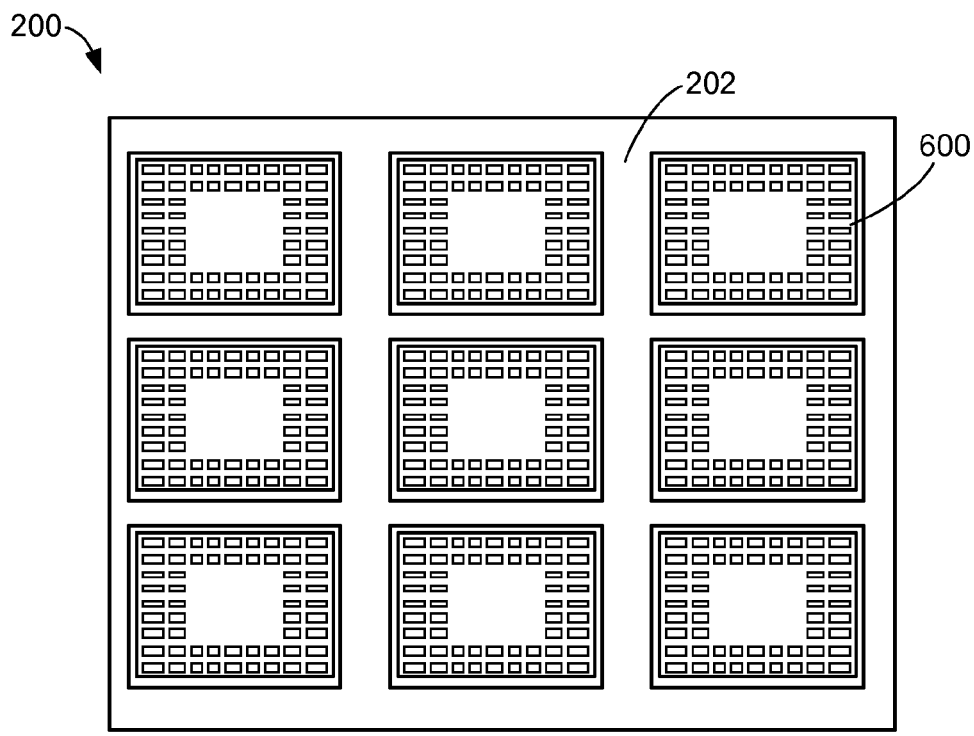
FIG. 2 is a plan view of a top center gate mold system in accordance with an embodiment of the present invention.
Figure 3:
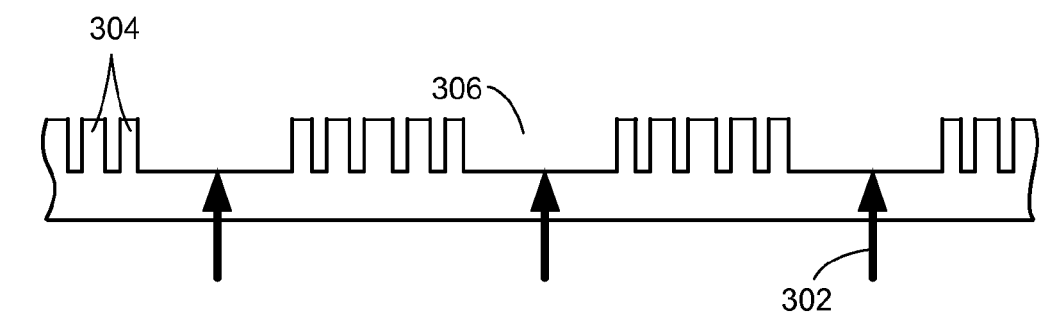
FIG. 3 is a section view of a mold plate, such as a top center gate mold plate design, in accordance with an embodiment of the present invention.

FIGS. 2 and 3, show a plan view of a top center gate mold system 200 and a section view of a mold plate 300, such as, a middle mold plate design, a first mold plate, or a second mold plate, in accordance with an embodiment of the present invention. The mold plate 300, of FIGS. 3 and 5, forms the discrete hollow conduits 110, of FIG. 1. As an exemplary illustration, the top center gate mold system 200, of FIG. 2, depicts a 3×3 array of an integrated circuit package system 600, of FIG. 6. Between each of the integrated circuit package systems 600 are channels 202 that allow for distribution of the material 108, of FIG. 1. After the integrated circuit package systems 600 are aligned to permit formation of the channels 202, the mold plate 300 is placed over the top center gate mold system 200.

Middle mold plate design arrows 302, of FIG. 3, depict gates of entry for the material 108. The material 108 flows around a honeycomb meshwork of posts 304 and fills semiconductor die mold regions 306, as well as, the areas between the honeycomb meshwork of posts 304. After a sufficient amount of time has elapsed, the mold plate 300 is removed, and left in its place is a support layer, comprised by the material 108, with the discrete hollow conduits 110 formed within. Although FIGS. 2 and 3 depict a 3×3 array, it is to be understood that any array suitable for manufacturing may be employed.

Figure 4:
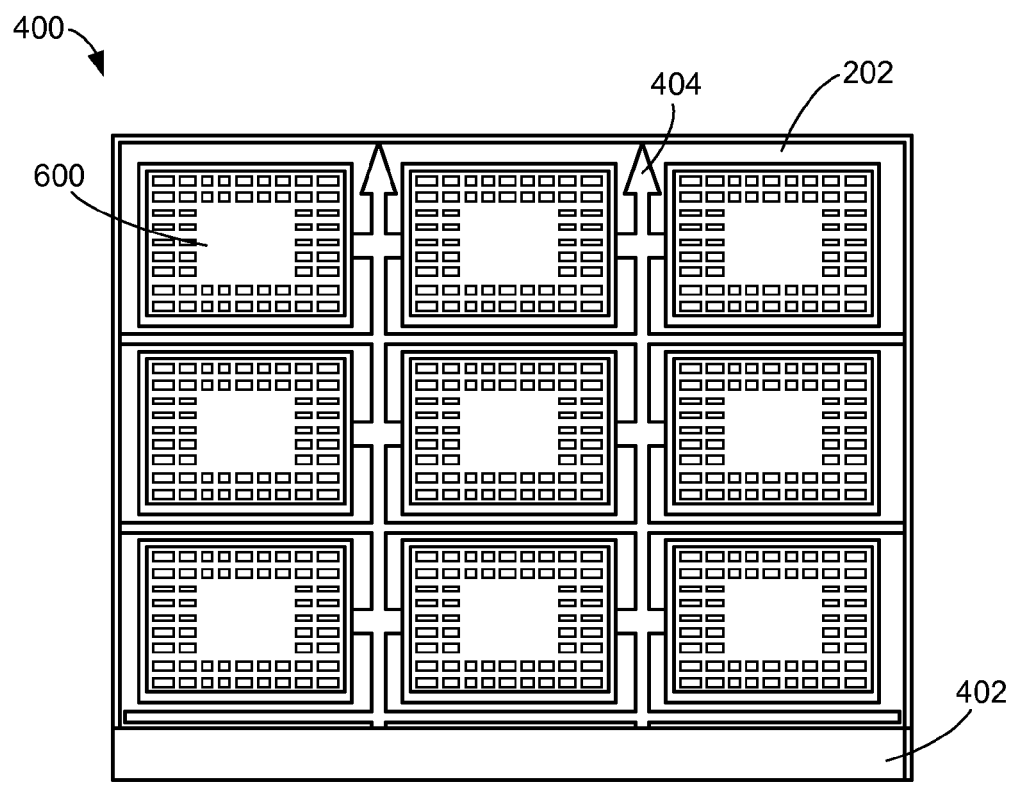
FIG. 4 is a plan view of a side mold system in accordance with an embodiment of the present invention.
Figure 5:
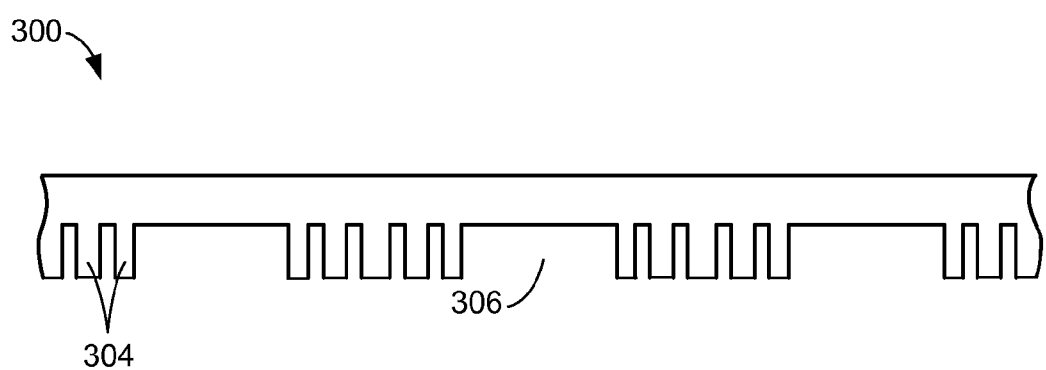
FIG. 5 is a section view of a mold plate, such as a top chaser mold plate, in accordance with an embodiment of the present invention.

FIGS. 4 and 5, show a plan view of a side mold system 400 and a section view of the mold plate 300, such as, a top chaser mold plate, the first mold plate, or the second mold plate, in accordance with another embodiment of the present invention. FIGS. 4 and 5 depict similar configurations as to FIGS. 2 and 3, therefore, only the differences between the figures will be described, to avoid redundancy.

During manufacturing, the side mold system 400 employs the top chaser mold plate placed over the side mold system 400. Just as with the top center gate mold system 200, of FIG. 2, the side mold system 400 also utilizes the channels 202 for distribution of the material 108, of FIG. 1. However, the side mold system 400 makes use of a material reservoir 402 adjacent the side mold system 400. Mold arrows 404 indicate the direction of flow of the material 108 around and within the integrated circuit package system 600 of FIG. 6. The top chaser mold plate, with the honeycomb meshwork of posts 304 and the semiconductor die mold regions 306, may be removed after a sufficient amount of time to reveal a support layer, comprised by the material 108 of FIG. 1 with the discrete hollow conduits 110 of FIG. 1 formed within. Although FIGS. 4 and 5 depict a 3×3 array, it is to be understood that any array suitable for manufacturing may be employed.

Figure 6:
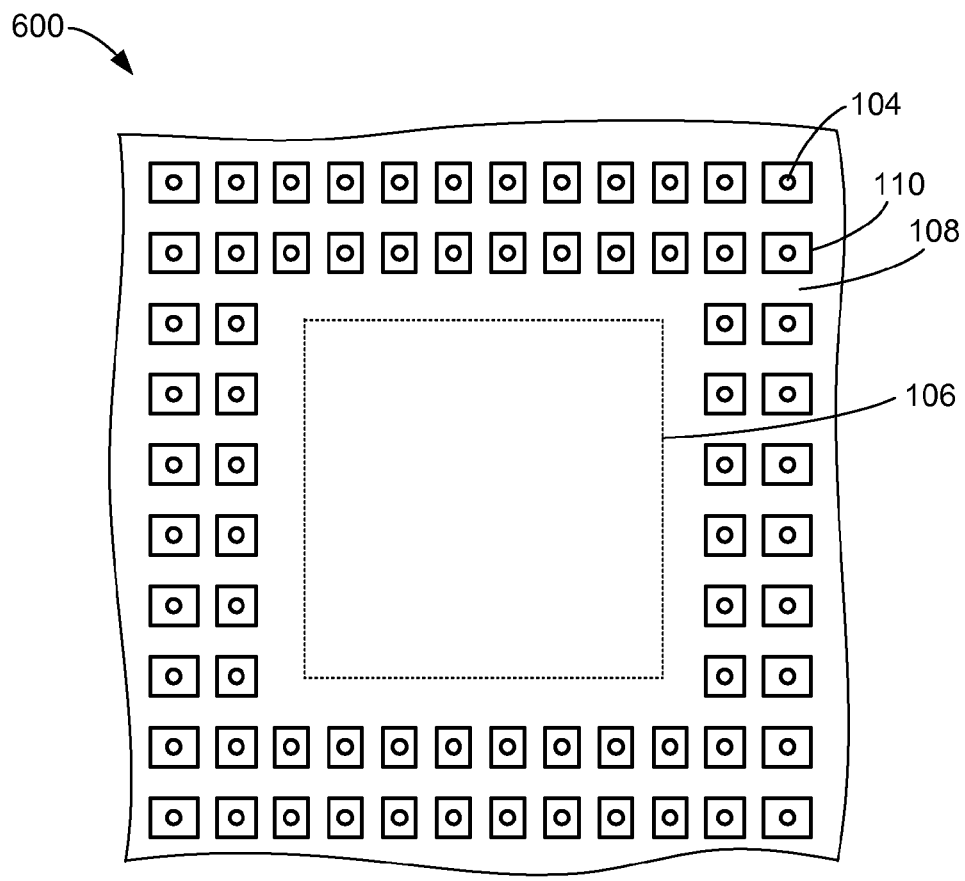
FIG. 6 is a plan view of an integrated circuit package system in accordance with an embodiment of the present invention.

Referring now to FIG. 6, therein is shown a plan view of an integrated circuit package system 600 in accordance with an embodiment of the present invention. The integrated circuit package system 600 includes the electrical contacts 104, the semiconductor die 106, the material 108 and the discrete hollow conduits 110. Initially, the semiconductor die 106 is aligned and adhered to the center of the substrate 102 (not shown). By way of example and not by way of limitation, an adhesive compound may be employed to affix the semiconductor die 106 to a semiconductor die pad located centrally on the substrate 102.

After adhering the semiconductor die 106, the mold plate 300, of FIGS. 3 and 5, with the honeycomb meshwork of posts 304 is laid over the substrate 102. The honeycomb meshwork of posts 304 is aligned to coincide with the electrical contacts 104 on the substrate 102.

After aligning the mold plate 300, the material 108 is deposited between the substrate 102 and the mold plate 300 by techniques well know in the art, such as, top center gate molding and side and/or corner molding. The material 108 may be a plastic, resin or epoxy. However, it is to be understood that the composition of the material 108 is not essential, what is important is that the material 108 provide encapsulation for the semiconductor die 106 and be sufficiently rigid to prevent warping of the substrate 102 during later processing steps.

After a sufficient lapse of time, the mold plate 300 with the honeycomb meshwork of posts 304 is removed, and in its place is left a rigid support layer (i.e.—the material 108) with the discrete hollow conduits 110 providing access to the electrical contacts 104. In at least one embodiment, the discrete hollow conduits 110 can be formed over the electrical contacts 104 and larger than the electrical contacts 104. By forming the discrete hollow conduits 110 in such manner, the material 108 provides a rigid support layer that prevents warping of the substrate 102 during later processing steps. By preventing the warpage so common to package, the electrical pathways between adjacent substrates can be enhanced and the incidence of device or package malfunction, due to failed interconnections, can be prevented.

The electrical contacts 104, mentioned above, provide electrical contact points between adjacent substrates. Just as the external electrical connections 114 of FIG. 1 remain in the original horizontal plane so do the electrical contacts 104 of FIGS. 1 and 6. By remaining in the same plane (i.e.—the electrical contacts 104 are neither deflected upwards or downwards during processing), the stability of the electrical contacts 104 enhances the probability of forming reliable electrical interconnections between adjacent substrates. Such resistance to deflection during processing increases the KGD aspect of PoP and PiP package structures, and consequently, improves product yield and decreases production costs.

Although FIG. 1 depicted the application of the material 108 to the integrated circuit package system 100, it is to be understood that the integrated circuit package system 600 of FIG. 6, applies to any substrate employed in stacked package, such as, PoP and PiP design. For purposes of illustration, the integrated circuit package system 600 can be employed in the integrated circuit package system 100, a top package or a package formed between the integrated circuit package system 100 and the top package.

Furthermore, although FIG. 6 depicts the discrete hollow conduits 110 formed in the shape of squares, it is to be understood that the discrete hollow conduits 110 may be formed from any shape. For example, the discrete hollow conduits 110 may be shaped as circles, hexagons, squares, or any combination thereof.

Figure 7:
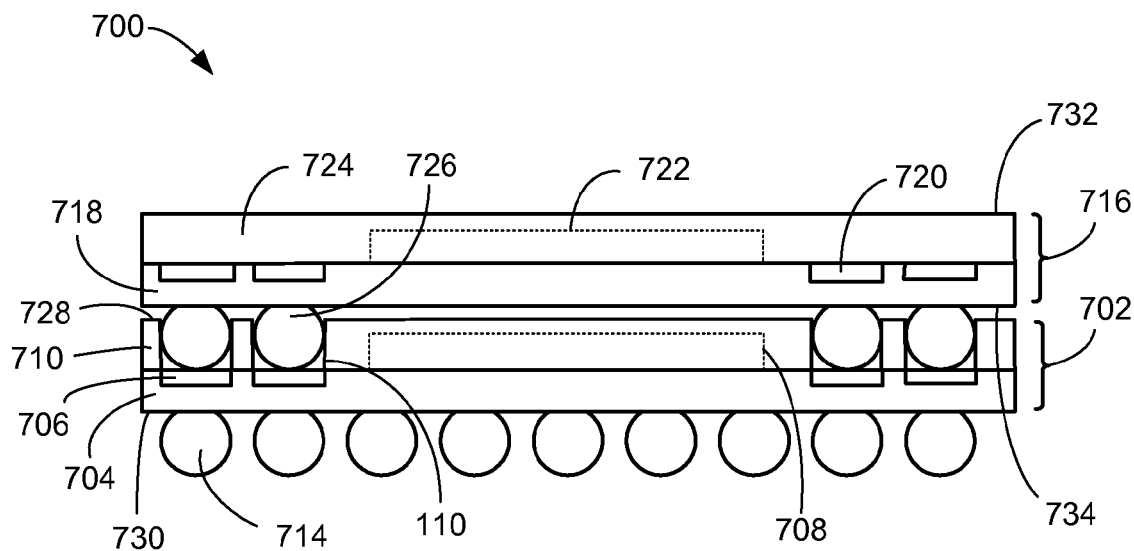
FIG. 7 is a section view of an integrated circuit package system in accordance with an embodiment of the present invention.

Referring now to FIG. 7, therein is shown a section view of an integrated circuit package system 700 in accordance with an embodiment of the present invention. The integrated circuit package system 700, such as an integrated circuit stacked package system, depicts a first package 702 and a second package 716 after reflowing. The first package 702 includes a first substrate 704, first electrical contacts 706, a first semiconductor die 708, a first material 710, first discrete hollow conduits 110, and first external electrical connections 714. The second package 716 includes a second substrate 718, second electrical contacts 720, a second semiconductor die 722, a second material 724, and second external electrical connections 726. In the embodiment of FIG. 7, the first discrete hollow conduits 110 are filled by the second external electrical connections 726.

Initially, the integrated circuit package system 700 forms a first package 702. The first package 702 includes a first substrate 704. The first substrate 704 includes a first top surface 728 and a first bottom surface 730, wherein the first top surface 728 includes the first electrical contacts 706 and the first bottom surface 730 includes the first external electrical connections 714. The first material 710 is deposited between the first substrate 704 and a first mold plate (not shown) formed over the first substrate 704. The first mold plate is removed to reveal the first discrete hollow conduits 110 formed within the first material 710. The first discrete hollow conduits 110 are aligned over the first electrical contacts 706 of the first substrate 704.

Then, the second package 716 is provided with the second substrate 718. The second substrate 718 includes a second top surface 732 and a second bottom surface 734, wherein the second top surface 732 includes the second electrical contacts 720 and the second bottom surface 734 includes the second external electrical connections 726. The second external electrical connections 726 are aligned over the first substrate 704 to coincide with the first electrical contacts 706 of the first substrate 704. The second external electrical connections 726 are reflowed to provide electrical interconnections to the first substrate 704 through the first discrete hollow conduits 110 formed within the first material 710 over the first substrate 704.

The first discrete hollow conduits 110 comprise a part of the rigid support layer (i.e.—the first material 710) that imparts stability to the first substrate 704 of the first package 702. The second material 724 may also impart stability to the second substrate 718 of the second package 716. The stability imparted by the first material 710 and the second material 724 prevents the first substrate 704 and the second substrate 718 from warping, and consequently, enhances the quality and durability of the interconnections between the two packages.

Additionally, the second material 724 can be deposited between the second substrate 718 and a second mold plate (not shown) formed over the second substrate 718. The second mold plate can be removed to reveal second discrete hollow conduits formed within the second material 724 over the second substrate 718. Although the second material 724 of the second package 716 does not depict the second discrete hollow conduits, the second material 724 may contain the second discrete hollow conduits, and correspondingly, have another package superposed over the second package 716. The present invention is not to be limited to a single package over another package configuration. The present invention envisions multiple packages formed one over the other, only limited by the design specifications of the particular application.

Furthermore, it is to be understood that the first discrete hollow conduits 110 and the second discrete hollow conduits may be formed from shapes such as circles, squares, hexagons, and combinations thereof.

FIGS. 8 through 12 depict similar configurations employed in FIGS. 1 and 4 through 7. Therefore, only the differences between the figures will be described, to avoid redundancy.

Figure 8:
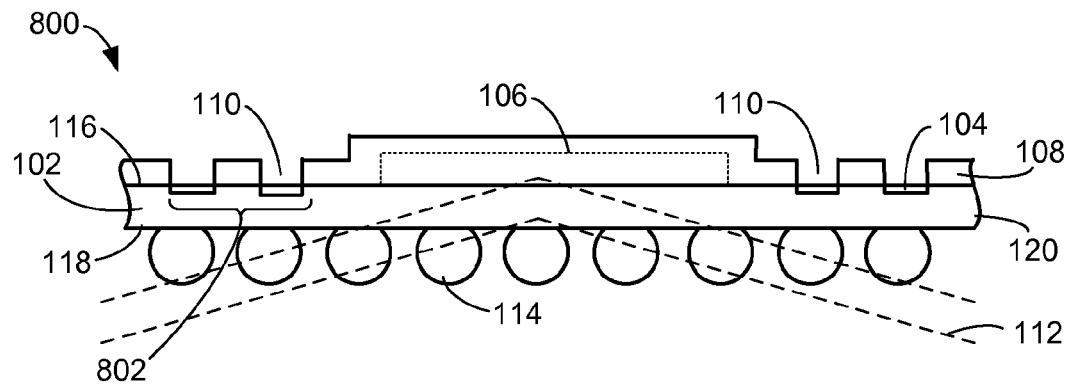
FIG. 8 is a section view of an integrated circuit package system after reflow in accordance with another embodiment of the present invention.

Referring now to FIG. 8, therein is shown a section view of an integrated circuit package system 800 after reflow in accordance with another embodiment of the present invention. The integrated circuit package system 800, such as a stepped bottom package, includes the substrate 102, the electrical contacts 104, the semiconductor die 106, the material 108, the discrete hollow conduits 110, such as, stepped discrete hollow conduits, first discrete hollow conduits, or second discrete hollow conduits, the dotted lines 112, the external electrical connections 114, the top surface 116, the bottom surface 118, the perimeter 120, and contact regions 802. Just as with FIG. 1, the integrated circuit package system 800 experiences little deflection from its original horizontal plane due to the structural support offered by the material 108. The dotted lines 112 are representative of the characteristic warpage incurred by prior art bottom packages.

Most notably, FIG. 8 employs the material 108 in a stepped configuration. Per this embodiment, the material 108 encases the semiconductor die 106 but deposits less of the material 108 over the contact regions 802. By depositing less of the material 108 over the contact regions 802, the aspect ratio of the discrete hollow conduits 110 is decreased while maintaining the support provided by the material 108 to the substrate 102. Although not intended to limit the scope of the present invention, some aspects provided by the stepped configuration include reduced material costs and decreased reflow distance of the external electrical connections 114.

Figure 9:
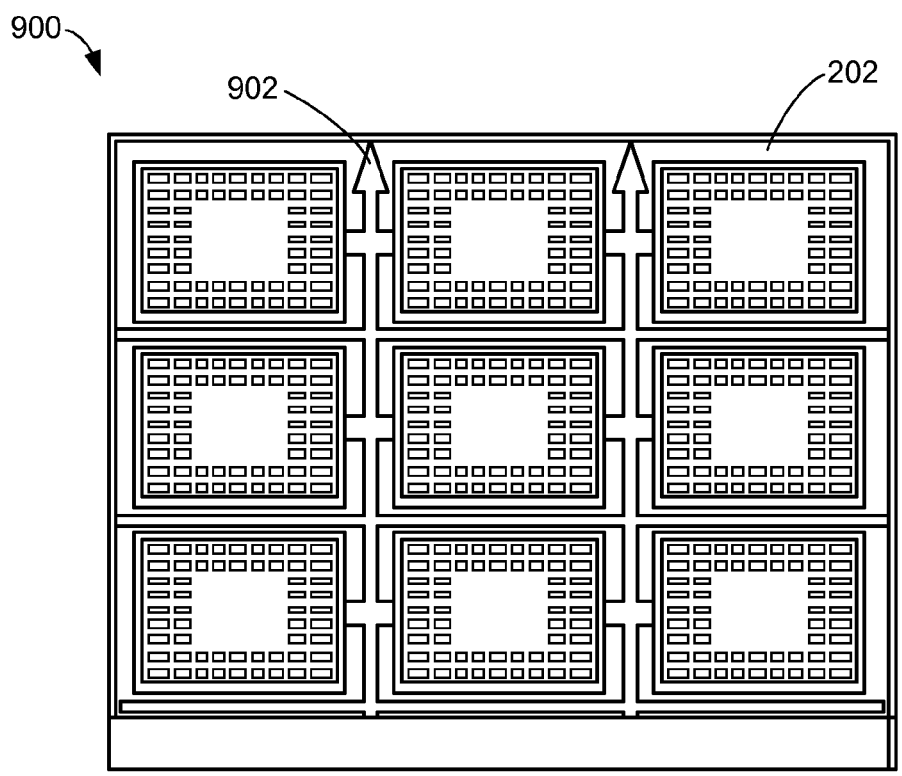
FIG. 9 is a plan view of a stepped side mold system in accordance with an embodiment of the present invention.
Figure 10:
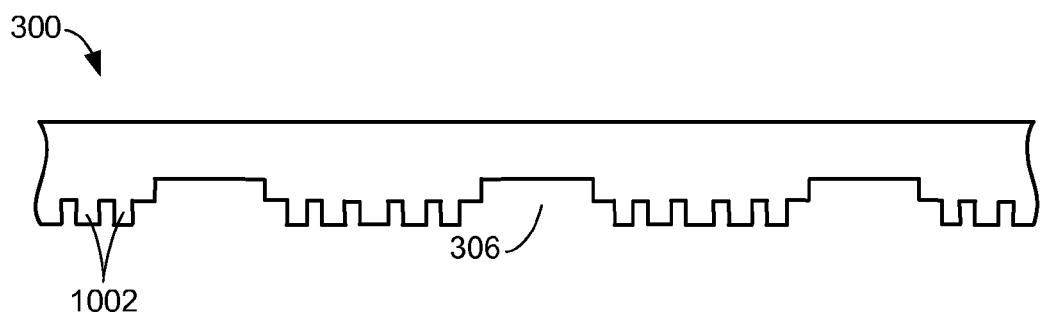
FIG. 10 is a section view of a mold plate, such as a stepped top chaser mold plate, in accordance with an embodiment of the present invention.

Referring now to FIGS. 9 and 10, therein is shown a plan view of a stepped side mold system 900 and a section view of the mold plate 300, such as, a stepped top chaser mold plate, the first mold plate, or the second mold plate, in accordance with an embodiment of the present invention. The stepped side mold system 900 also utilizes the channels 202 for distribution of the material 108, of FIG. 8. Stepped side mold arrows 902 indicate the direction of flow of the material 108 around and within the integrated circuit package system 1100, of FIG. 11. Most notably, the stepped top chaser mold plate utilizes the semiconductor die mold regions 306 and a stepped honeycomb meshwork of posts 1002. Such configuration reduces the aspect ratio of the discrete hollow conduits 110, of FIG. 8.

Although FIGS. 9 and 10 depict a 3×3 array, it is to be understood that any array suitable for manufacturing may be employed. Additionally, although FIGS. 9 and 10 depict a side molding technique, it is to be understood that this illustration is merely being provided for exemplary purposes and is not intended to limit the scope of the present invention.

Figure 11:
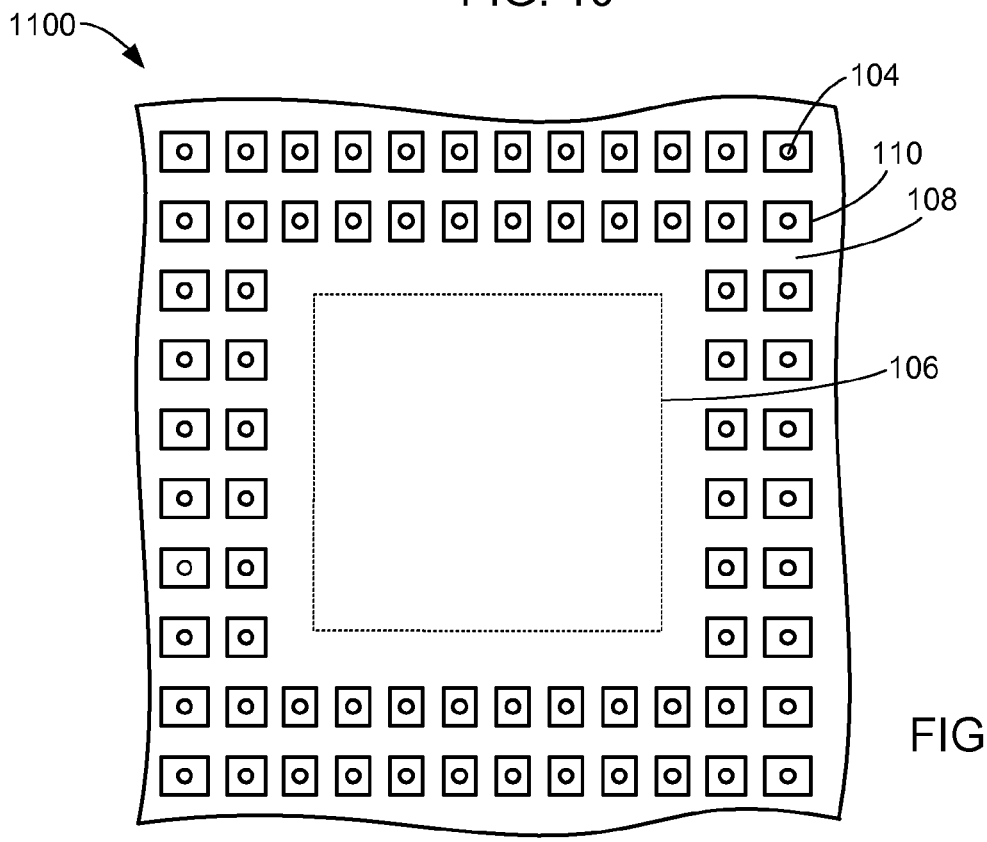
FIG. 11 is a plan view of an integrated circuit package system in accordance with an embodiment of the present invention.

Referring now to FIG. 11, therein is shown a plan view of the integrated circuit package system 1100 in accordance with an embodiment of the present invention. The integrated circuit package system 1100, such as a stepped integrated circuit package system, includes the electrical contacts 104, the semiconductor die 106, the material 108, and the discrete hollow conduits 110. The integrated circuit package system 1100 also uses the mold plate 300 (not shown), such as the stepped top chaser mold plate, when depositing the material 108. The mold plate 300 employed in this embodiment casts the material 108, within the contact regions 802, in a stepped configuration.

Although FIG. 8 depicted the application of the material 108 to the integrated circuit package system 800, it is to be understood that the integrated circuit package system 1100, of FIG. 11, applies to any substrate employed in stacked package, such as, PoP and PiP design. For purposes of illustration, the integrated circuit package system 1100 can be employed in the integrated circuit package system 800, a top package or a package formed between the integrated circuit package system 800 and the top package.

Furthermore, although FIG. 11 depicts the discrete hollow conduits 110 formed in the shape of squares, it is to be understood that the discrete hollow conduits 110 may be formed from any shape. For example, the discrete hollow conduits 110 may be shaped as circles, hexagons, squares, or any combination thereof.

Figure 12:
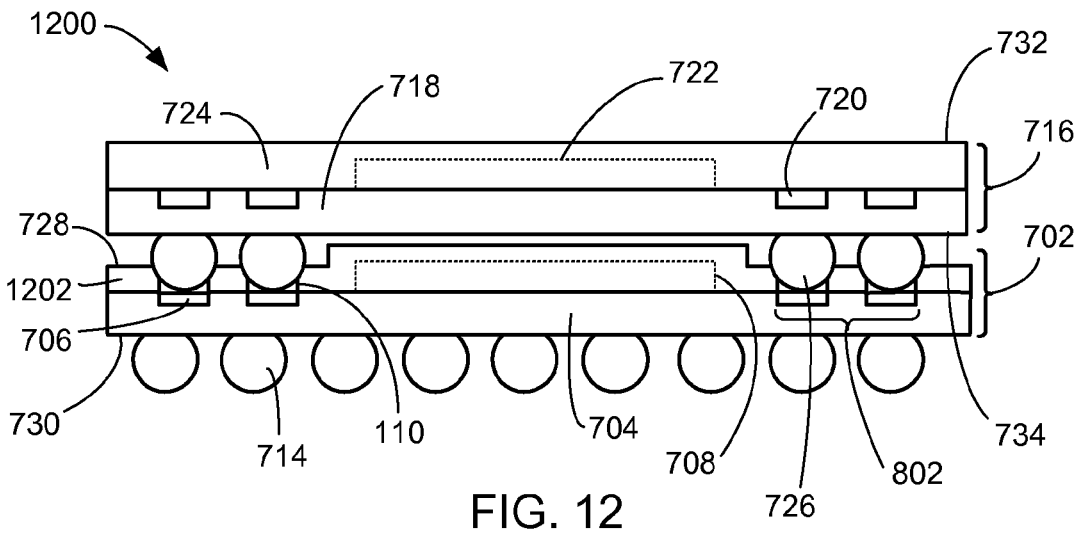
FIG. 12 is a section view of an integrated circuit package system in accordance with an embodiment of the present invention.

Referring now to FIG. 12, therein is shown a section view of an integrated circuit package system 1200 in accordance with an embodiment of the present invention. The integrated circuit package system 1200, such as a stepped integrated circuit stacked package system, depicts the first package 702 and the second package 716 after reflowing. The first package 702 includes the first substrate 704, the first electrical contacts 706, the first semiconductor die 708, the first discrete hollow conduits 110, the first external electrical connections 714 and first stepped material 1202. The second package 716 includes the second substrate 718, the second electrical contacts 720, the second semiconductor die 722, the second material 724, and the second external electrical connections 726. Per the embodiment of FIG. 12, the first discrete hollow conduits 110 are filled by the second electrical connections 726. Additionally, the first substrate 704 includes the first top surface 728 and the first bottom surface 730 and the second substrate 718 includes the second top surface 732 and the second bottom surface 734.

Most notably, the first stepped material 1202 employs a stepped configuration within the contact regions 802 that imparts stability to the first substrate 704 of the first package 702. Although the second package 716 depicts the second material layer 724 without a stepped configuration or the second discrete hollow conduits, the second material layer 724 may possess a stepped configuration, as well as, the second discrete hollow conduits. By forming the second material layer 724 with the stepped configuration and the second discrete hollow conduits, another package may be superposed over the second package 716. The present invention is not to be limited to a single stepped package over another stepped package configuration. The present invention envisions multiple stepped packages formed one over the other, only limited by the design specifications of the particular application.

Furthermore, it is to be understood that the first discrete hollow conduits 110 and the second discrete hollow conduits may be formed from shapes such as circles, squares, hexagons, and combinations thereof.

Referring now to FIGS. 13 through 16, therein are shown plan views of multiple package systems in accordance with different embodiments of the present invention. FIGS. 13 through 16 depict the different shapes of the electrical contacts 104 that can be employed within the multiple package systems. It is to be understood that the multiple package systems of FIGS. 13 through 16 apply to the integrated circuit package systems 600, of FIG. 6, as well as, the integrated circuit package system 1100, of FIG. 11. Additionally, although FIGS. 13 through 16 depict the electrical contacts 104 shaped either as circles, hexagons, or squares, it is to be understood that the electrical contacts 104 within a package system can be any combination of these shapes, as well.

Figure 13:
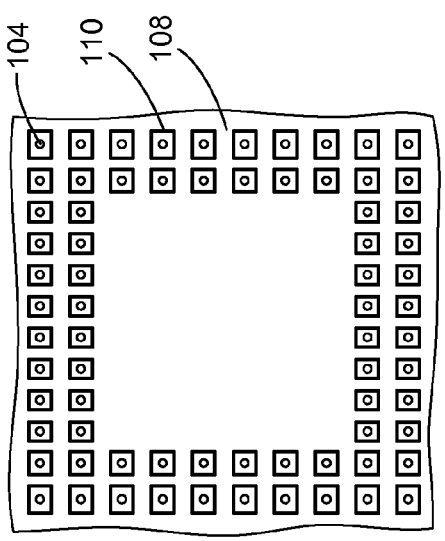
FIG. 13 is a plan view of a package system in accordance with another embodiment of the present invention.

FIG. 13 includes the electrical contacts 104, the material 108, and the discrete hollow conduits 110. Most notably, FIG. 13 depicts the electrical contacts 104 shaped as circles.

Figure 14:
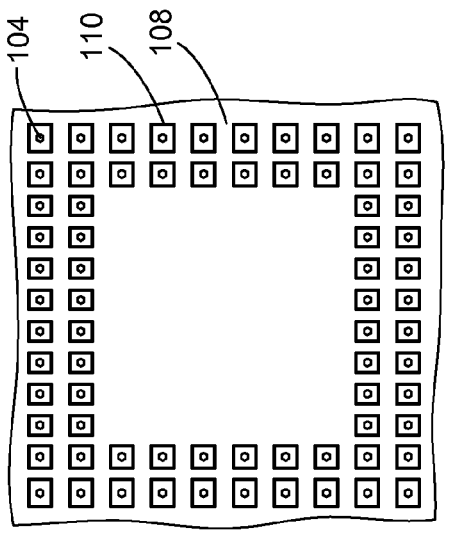
FIG. 14 is a plan view of a package system in accordance with another embodiment of the present invention.

FIG. 14 includes the electrical contacts 104, the material 108, and the discrete hollow conduits 110. Most notably, FIG. 14 depicts the electrical contacts 104 shaped as hexagons.

Figure 15:
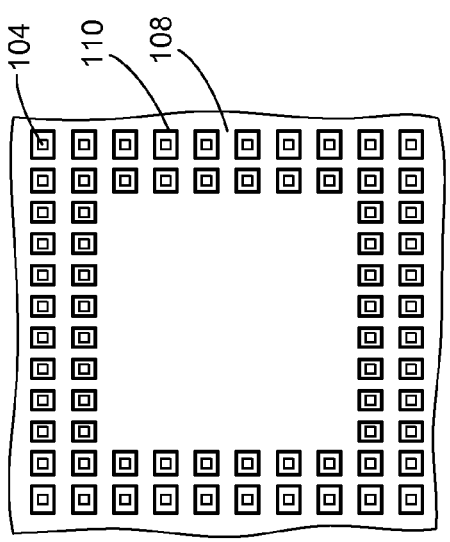
FIG. 15 is a plan view of a package system in accordance with another embodiment of the present invention.

FIG. 15 includes the electrical contacts 104, the material 108, and the discrete hollow conduits 110. Most notably, FIG. 15 depicts the electrical contacts 104 shaped as squares.

Figure 16:
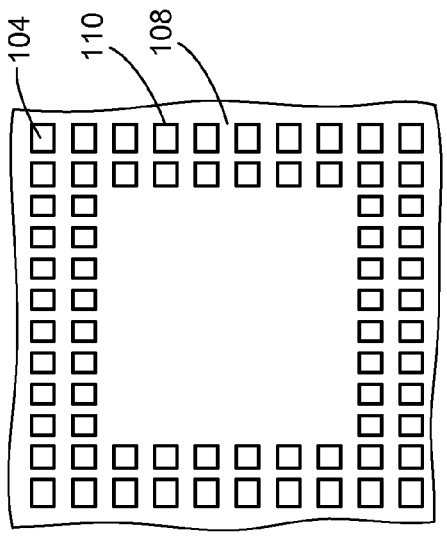
FIG. 16 is a plan view of a package system in accordance with another embodiment of the present invention.

FIG. 16 includes the electrical contacts 104, the material 108, and the discrete hollow conduits 110. Most notably, FIG. 16 depicts the electrical contacts 104 as possessing the same shape and dimensions as the openings provided by the discrete hollow conduits 110.

Figure 17:
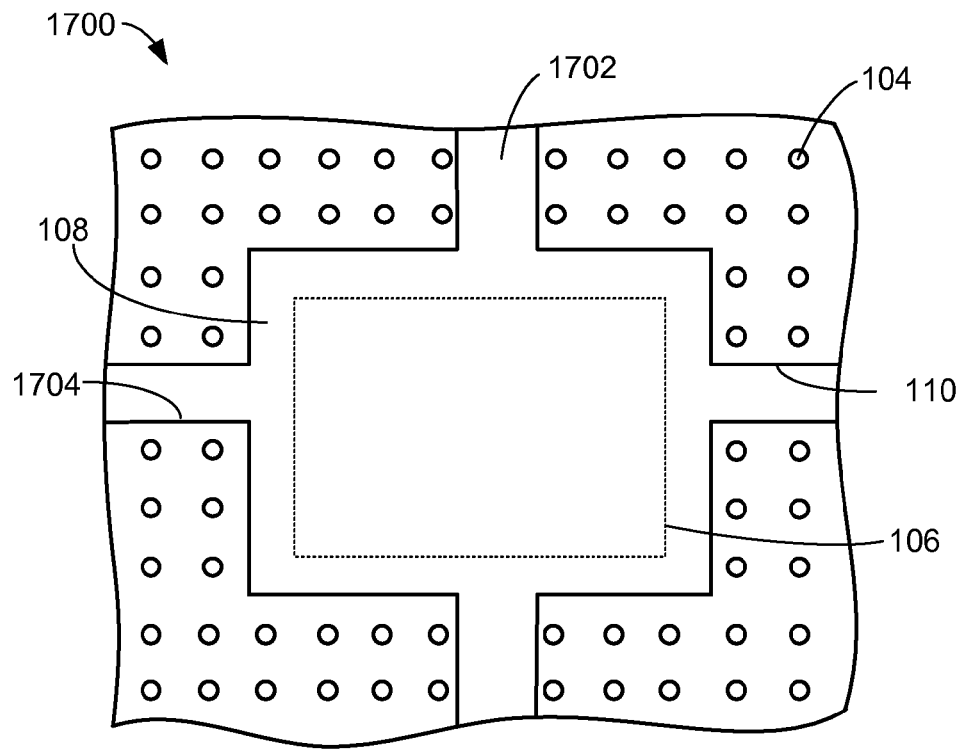
FIG. 17 is a plan view of traces routed to provide larger mold paths for an integrated circuit package system in accordance with another embodiment of the present invention.

Referring now to FIG. 17, therein is shown a plan view of traces 1702 routed to provide larger mold paths for an integrated circuit package system 1700 in accordance with another embodiment of the present invention. The traces 1702 extend from the semiconductor die 106 and are enlarged to facilitate the flow of the material 108 throughout the integrated circuit system. Generally, the traces 1702 can be configured to extend from the sides of the semiconductor die 106. In at least one embodiment, each of an L-shaped region 1704 can be separated from the other of the L-shaped regions 1704 by the traces 1702.

Per this embodiment, the mold plate 300 (not shown) contains a honeycomb meshwork of posts or a stepped honeycomb meshwork of posts that covers the L-shaped regions 1704. By covering the L-shaped regions 1704 with the mold plate 300, the electrical contacts 104 are not obscured by the material 108. Consequently, the electrical contacts 104 remain exposed, after removal of the mold plate 300, for attachment to a superposed substrate (not shown). The L-shaped regions 1704 exposed after the removal of the mold plate 300 act(s) as the discrete hollow conduits 110 and, as with the previous embodiments, the material 108 imparts structural stability to the package.

Figure 18:
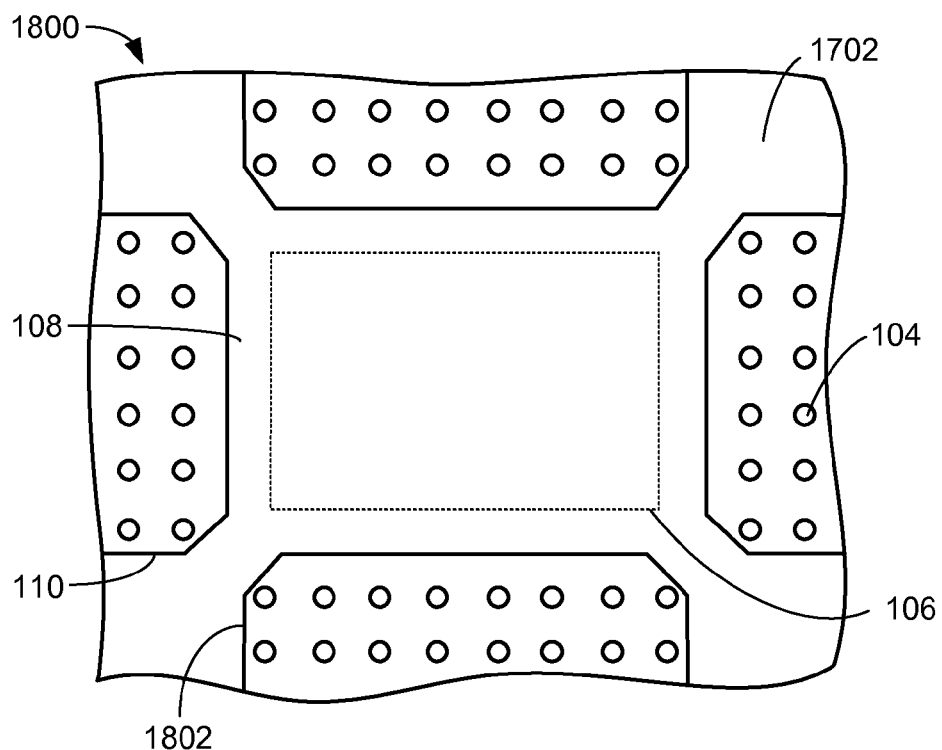
FIG. 18 is a plan view of traces routed to provide larger mold paths for an integrated circuit package system in accordance with another embodiment of the present invention.

Referring now to FIG. 18, therein is shown a plan view of the traces 1702 routed to provide larger mold paths for an integrated circuit package system 1800 in accordance with another embodiment of the present invention. The traces 1702 extend from the semiconductor die 106 and are enlarged to facilitate the flow of the material 108 throughout the integrated circuit system. In at least one embodiment, each of a rectangular shaped region 1802 can have the nearest adjacent corners between adjacent ones of the rectangular shaped regions 1802 clipped or chamfered, thereby further facilitating the flow of the material 108 throughout the integrated circuit system. In yet another embodiment, each of the rectangular shaped regions 1802 can be separated from the other of the rectangular shaped regions 1802 by the traces 1702. Generally, the traces 1702 can be configured to extend from the corners of the semiconductor die 106.

Per this embodiment, the mold plate 300 (not shown) contains a honeycomb meshwork of posts or a stepped honeycomb meshwork of posts that covers the rectangular shaped regions 1802. By covering the rectangular shaped regions 1802 with the mold plate 300, the electrical contacts 104 are not obscured by the material 108. Consequently, the electrical contacts 104 remain exposed, after removal of the mold plate 300, for attachment to a superposed substrate (not shown). The rectangular shaped regions 1802 exposed after the removal of the mold plate 300 act as the discrete hollow conduits 110 and, as with the previous embodiments, the material 108 imparts structural stability to the package.

Figure 19:
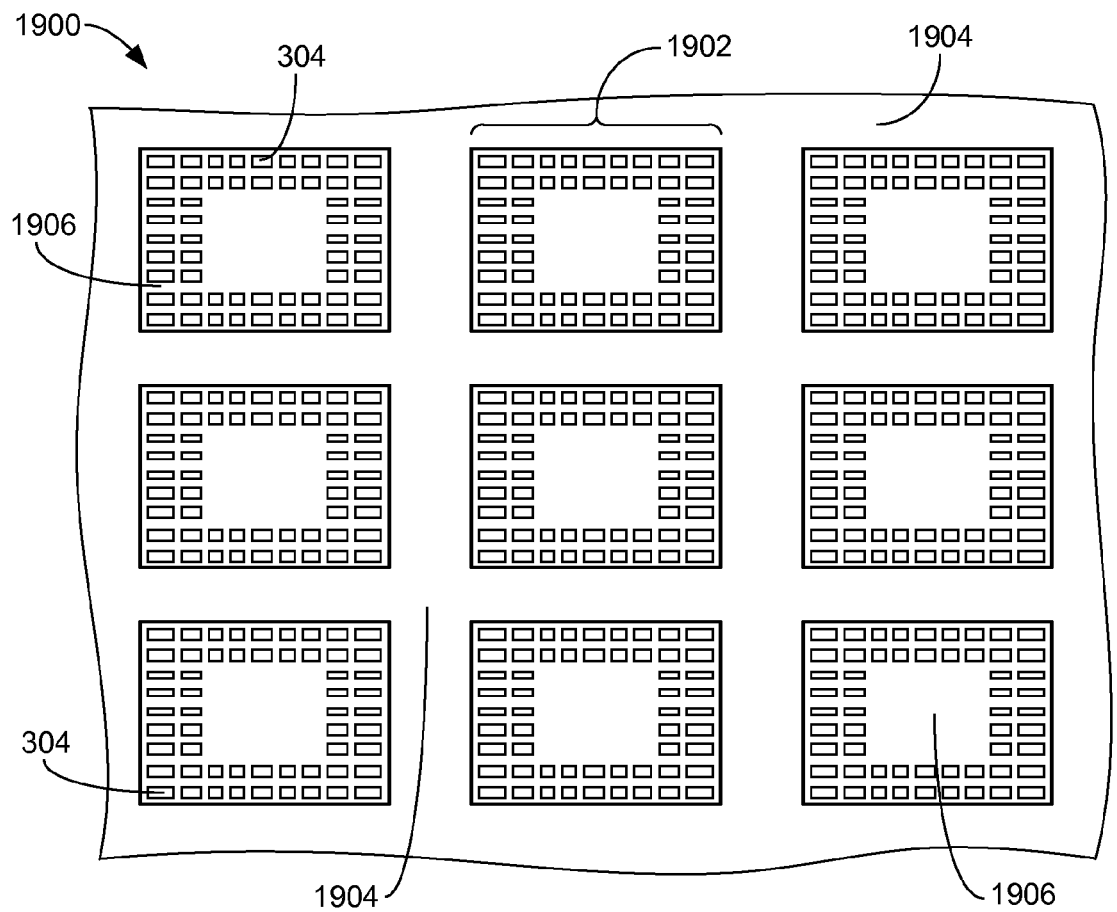
FIG. 19 is a top view of a mold plate in accordance with another embodiment of the present invention.

Referring now to FIG. 19, therein is shown a top view of a mold plate 1900 in accordance with another embodiment of the present invention. Per this embodiment, the mold plate 1900 includes a 3×3 array of a unit cell 1902; however, it is to be understood that the current embodiment is merely exemplary and not limiting. For example, the mold plate 1900 may include more, fewer or different configurations of the unit cell 1902. The term "unit cell" as used herein is defined as an area including the honeycomb meshwork of posts 304 and the semiconductor die mold region 306 within a set of the honeycomb meshwork of posts 304. Additionally, it is to be understood that the mold plate 1900 may include a structure capable of defining the boundaries of any encapsulant or underfill.

In at least one embodiment, the mold plate 1900 may include a top surface 1904 and a bottom surface 1906. It is to be understood that the top surface 1904 of the mold plate 1900 can be designed to contact the top surface 116 of the substrate 102, both of FIG. 1. Generally, the material 108, of FIG. 1, can be deposited within the area of the bottom surface 1906 to surround the honeycomb meshwork of posts 304, the electrical contacts 104, of FIG. 1, and the semiconductor die 106, of FIG. 1, and is blocked in the regions of the top surface 1904. Per this embodiment, the mold plate 1900 configuration enables the semiconductor die 106 to be fully encapsulated by the material 108, while the electrical contacts 104 are left exposed due to the formation of the honeycomb meshwork of posts 304 over the electrical contacts 104.

By way of example, the mold plate 1900 can be used with the top center gate mold system 200, of FIG. 2. Additionally, it will be appreciated by those skilled in the art that the integrated circuit package system 600, of FIG. 6, formed by the current embodiments may be employed within a package-on-package configuration or a package-in-package configuration.

Figure 20:
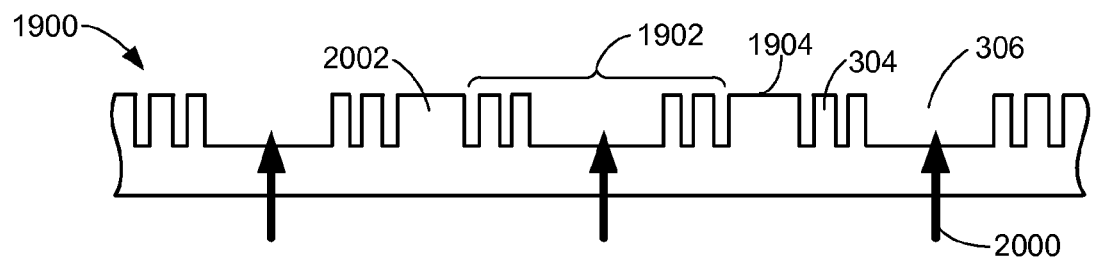
FIG. 20 is a side view of a mold plate in accordance with the embodiment of FIG. 19.

Referring now to FIG. 20, therein is shown a side view of the mold plate 1900 in accordance with the embodiment of FIG. 19. The mold plate 1900, such as a middle mold plate design, a first mold plate, or a second mold plate can be aligned over the substrate 102, of FIG. 1, with the honeycomb meshwork of posts 304 aligned over the electrical contact 104, of FIG. 1, and the semiconductor die mold regions 306 aligned over the semiconductor die 106, of FIG. 1.

Arrows 2000, depict gates of entry for the material 108, of FIG. 1. The material 108 flows around the honeycomb meshwork of posts 304 and fills the semiconductor die mold regions 306, as well as, the areas between the honeycomb meshwork of posts 304. A block post 2002 can be positioned between adjacent configurations of the honeycomb meshwork of posts 304 for adjacent ones of the unit cell 1902, to prevent the flow of the material 108 within a void space.

Generally, the void space can be formed between each of the unit cell 1902 transferred to the substrate 102 after depositing the material 108 and disengaging the mold plate 1900. The term "void space" as used herein is defined as an area of the substrate 102 without the material 108.

Generally, the top surface 1904 of the block post 2002 and the top surface 116, of FIG. 1, of the substrate 102 can be adapted for cooperative engagement within the void space. The designs of the block post 2002 and the substrate 102 are such that when mated together a secure contact occurs at the interface between the block post 2002 and the substrate 102. Per this invention, a secure contact can be defined as the amount of contact force necessary between adjacent surfaces that prevents processing failures due to separation of the surfaces during manufacturing operations. By way of example, a secure contact of the present embodiments helps to ensure that the material 108 does not leak between the block post 2002 and the substrate 102 into the void space.

It will be appreciated by those skilled in the art that a secure contact can also be formed between the honeycomb meshwork of posts 304 and the top surface 116 of the substrate 102, such as the electrical contacts 104.

After a sufficient amount of time has elapsed, the mold plate 1900 can be removed, and left in its place is a support layer, comprised by the material 108, with the discrete hollow conduits 110, of FIG. 1, formed within and over the electrical contacts 104. In at least one embodiment, the discrete hollow conduits 110 can be larger than the electrical contacts 104.

As with the other embodiments, the material 108 provides a rigid support layer that prevents warping of the substrate 102 during later processing steps. By preventing the warpage so common to packages, the electrical pathways between adjacent substrates can be enhanced and the incidence of device or package malfunction, due to failed interconnections, can be prevented.

Figure 21:
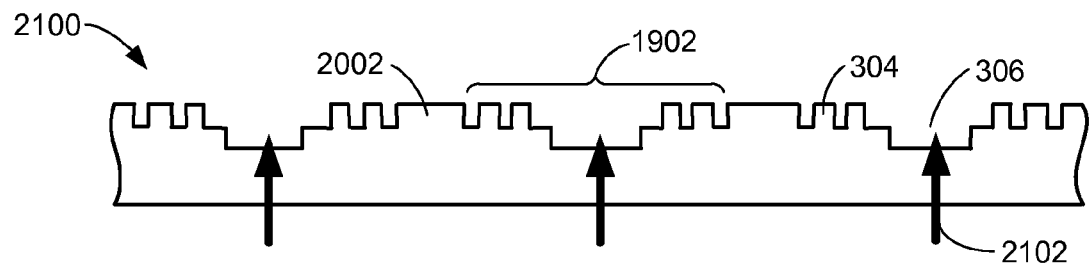
FIG. 21 is a side view of a mold plate in accordance with another embodiment of the present invention.

Referring now to FIG. 21, therein is shown a side view of a mold plate 2100 in accordance with another embodiment of the present invention. The mold plate 2100, such as a stepped middle mold plate design, a first mold plate, or a second mold plate can also be aligned over the substrate 102, of FIG. 1, with the honeycomb meshwork of posts 304 aligned over the electrical contact 104, of FIG. 1, and the semiconductor die mold regions 306 aligned over the semiconductor die 106, of FIG. 1. Additionally, it is to be understood that the mold plate 2100 may include a structure capable of defining the boundaries of any encapsulant or underfill.

Arrows 2102, depict gates of entry for the material 108, of FIG. 1. The material 108 flows around the honeycomb meshwork of posts 304 and fills the semiconductor die mold regions 306, as well as, the areas between the honeycomb meshwork of posts 304. The block post 2002 can be positioned between adjacent configurations of the honeycomb meshwork of posts 304 for adjacent ones of the unit cell 1902, to prevent the flow of the material 108 within a void space.

Per this embodiment, the material 108 encases the semiconductor die 106 but deposits less of the material 108 over the contact regions 802, of FIG. 8. By depositing less of the material 108 over the contact regions 802, the aspect ratio of the discrete hollow conduits 110, of FIG. 8, is decreased while maintaining the support provided by the material 108 to the substrate 102. Although not intended to limit the scope of the present embodiments, some aspects provided by the stepped configuration include reduced material costs and decreased reflow distance of an electrical connection formed within the discrete hollow conduits 110.

It will be appreciated by those skilled in the art that the length of the honeycomb meshwork of posts 304 for the mold plate 1900, of FIG. 19, can be reduced by about ten percent (10%) to about ninety percent (90%) for the honeycomb meshwork of posts 304 for the mold plate 2100 to help achieve the stepped configuration.

After a sufficient amount of time has elapsed, the mold plate 2100 can be removed, and left in its place is a support layer, comprised by the material 108, with the discrete hollow conduits 110 formed within the material 108 and over the electrical contacts 104.

Figure 22:
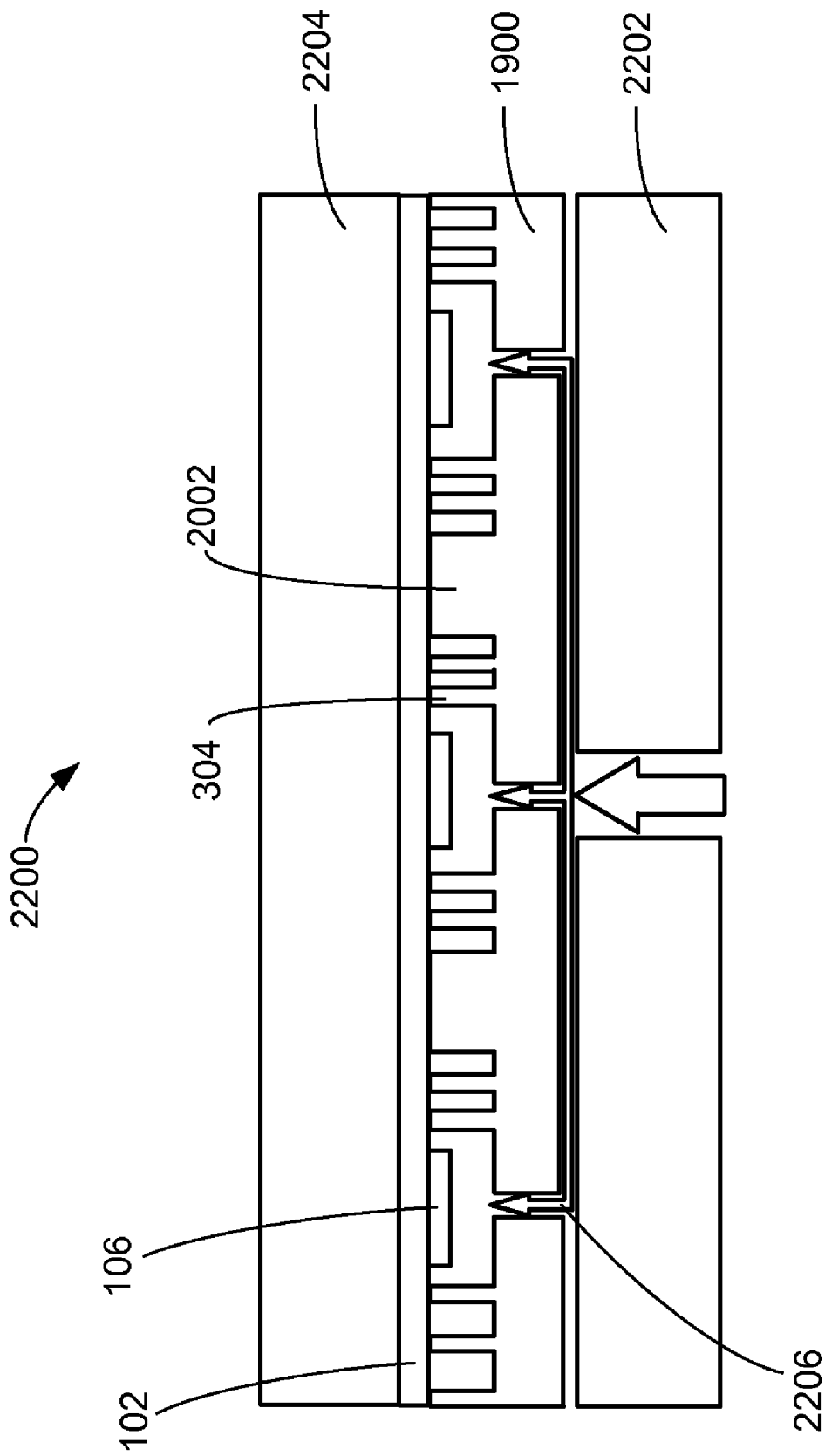
FIG. 22 is a cross sectional view of a mold system in accordance with the embodiments of FIGS. 19-21.

Referring now to FIG. 22, therein is shown a cross sectional view of a mold system 2200 in accordance with the embodiments of FIGS. 19-21. The mold system 2200 includes a bottom mold plate 2202, a top mold plate 2204, a mold flow passage 2206, the mold plate 1900, the substrate 102 and the semiconductor die 106. The material 108, of FIG. 1, can flow through the mold flow passage 2206 and enter over or under the semiconductor die 106, depending upon orientation, and flow around the honeycomb meshwork of posts 304. The designs of the honeycomb meshwork of posts 304, the block post 2002 and the substrate 102 are such that when mated together a secure contact occurs at the interface between the honeycomb meshwork of posts 304, the block post 2002 and the substrate 102.

In at least one embodiment, the outer portion of the mold plate 1900 along the perimeter of the mold system 2200 may include structures contacting the substrate 102 that are similar in dimension and function as the block post 2002. It is to be understood that these structures not only block the flow of the material 108 but they can also help fix the substrate 102 during the molding process.

It will be appreciated by those skilled in the art that the mold system 2200 can be commonly referred to as a top center gate mold system.

Figure 23:
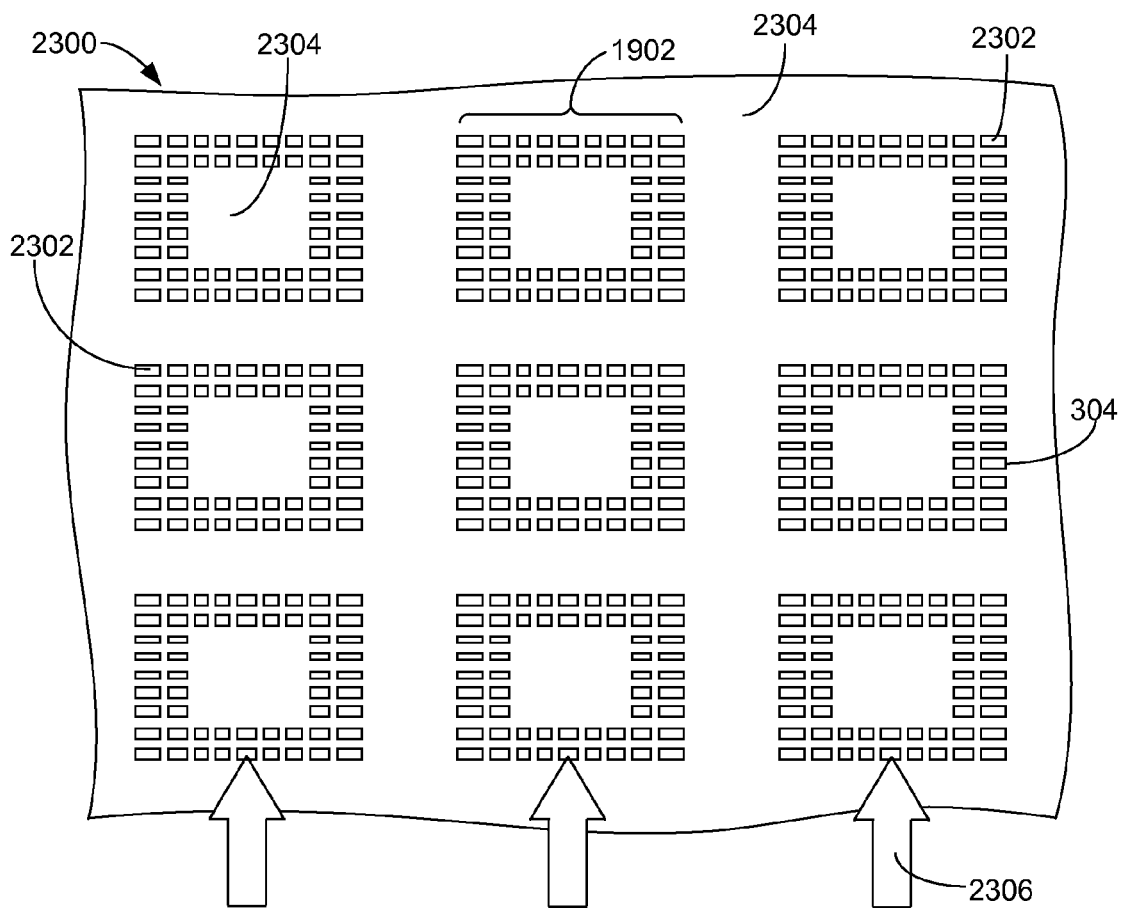
FIG. 23 is a bottom view of a mold plate in accordance with another embodiment of the present invention.

Referring now to FIG. 23, therein is shown a bottom view of a mold plate 2300 in accordance with another embodiment of the present invention. Per this embodiment, the mold plate 2300 includes a 3×3 array of the unit cell 1902; however, it is to be understood that current embodiment is merely exemplary and not limiting. For example, the mold plate 2300 may include more, fewer or different configurations of the unit cell 1902. Additionally, it is to be understood that the mold plate 2300 may include a structure capable of defining the boundaries of any encapsulant or underfill.

In at least one embodiment, the mold plate 2300 may include a top surface 2302 and a bottom surface 2304. It is to be understood that the top surface 2302 of the mold plate 2300 can be designed to directly contact the top surface 116 of the substrate 102, both of FIG. 1. Generally, the material 108, of FIG. 1, can be deposited within the area demarcated of the bottom surface 2304 to surround the honeycomb meshwork of posts 304, the electrical contacts 104, of FIG. 1, and the semiconductor die 106, of FIG. 1, and is blocked by the honeycomb meshwork of posts 304. Per this embodiment, the semiconductor die 106 can be fully encapsulated by the material 108, while the electrical contacts 104 are exposed.

By way of example, the mold plate 2300 can be used with the side mold system 400, of FIG. 4, wherein the side mold system 400 can make use of a reservoir for the material 108 (not shown) adjacent a side of the side mold system 400. Mold arrows 2306 indicate the direction of flow of the material 108 around and within the area defined by the bottom surface 2304. In at least one embodiment, the material 108 can enter from a side of the mold plate 2300 between the mold plate 2300 and the substrate 102.

Additionally, it will be appreciated by those skilled in the art that the integrated circuit package system 600, of FIG. 6, formed by the current embodiments may be employed within a package-on-package configuration or a package-in-package configuration.

Figure 24:
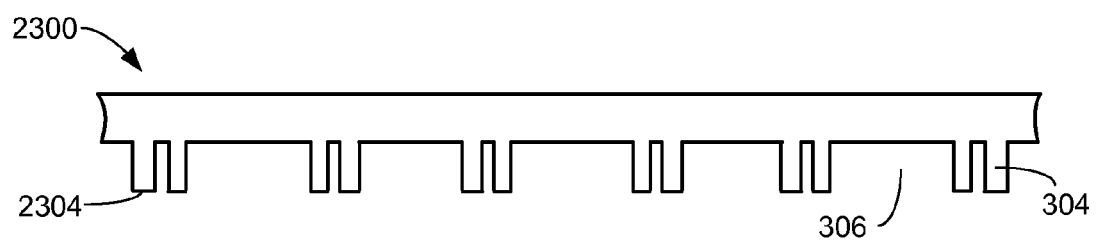
FIG. 24 is a side view of a mold plate in accordance with the embodiment of FIG. 23.

Referring now to FIG. 24, therein is shown a side view of the mold plate 2300 in accordance with the embodiment of FIG. 23. The mold plate 2300, such as a top chaser design, a first mold plate, or a second mold plate can be aligned over the side mold system 400, of FIG. 4, with the honeycomb meshwork of posts 304 aligned over the electrical contacts 104, of FIG. 1, and the semiconductor die mold regions 306 aligned over the semiconductor die 106, of FIG. 1.

The material 108, of FIG. 1, flows around the honeycomb meshwork of posts 304 and fills the semiconductor die mold regions 306, as well as, the areas between the honeycomb meshwork of posts 304. After a sufficient amount of time has elapsed, the mold plate 2300 can be removed, and left in its place is a support layer, comprised by the material 108, with the discrete hollow conduits 110, of FIG. 1, formed within and over the electrical contacts 104 by the honeycomb meshwork of posts 304. In at least one embodiment, the discrete hollow conduits 110 can be formed larger than the electrical contacts 104.

It will be appreciated by those skilled in the art that by only having the honeycomb meshwork of posts 304 directly contacting the top surface 116, of FIG. 1, of the substrate 102 that the flow of the material 108 can be facilitated (e.g., made easier) by creating larger mold pathways for distribution of the material 108.

Generally, the top surface 2302 of the honeycomb meshwork of posts 304 and the top surface 116, of FIG. 1, of the substrate 102 can be adapted for cooperative engagement, thereby creating a void space defined by the discrete hollow conduits 110. The designs of the honeycomb meshwork of posts 304 and the substrate 102 are such that when mated together a secure contact occurs at the interface between the honeycomb meshwork of posts 304 and the substrate 102. Per this invention, a secure contact can be defined as the amount of contact force necessary between adjacent surfaces that prevents processing failures due to separation of the surfaces during manufacturing operations. By way of example, a secure contact of the present embodiments helps to ensure that the material 108 does not leak between the honeycomb meshwork of posts 304 and the substrate 102 into the area defined by the discrete hollow conduits 110.

Figure 25:
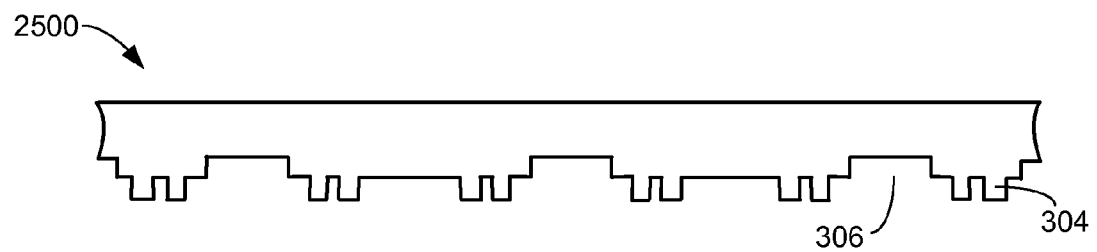
FIG. 25 is a side view of a mold plate in accordance with another embodiment of the present invention.

Referring now to FIG. 25, therein is shown a side view of a mold plate 2500 in accordance with another embodiment of the present invention. The mold plate 2500, such as a stepped middle mold plate design, a first mold plate, or a second mold plate can also be aligned over the side mold system 400, of FIG. 4, with the honeycomb meshwork of posts 304 aligned over the electrical contacts 104, of FIG. 8, and the semiconductor die mold regions 306 can be aligned over the semiconductor die 106, of FIG. 8. Additionally, it is to be understood that the mold plate 2500 may include a structure capable of defining the boundaries of any encapsulant or underfill.

The material 108, of FIG. 8, flows around the honeycomb meshwork of posts 304 and fills the semiconductor die mold regions 306, as well as, the areas between the honeycomb meshwork of posts 304. After a sufficient amount of time has elapsed, the mold plate 2500 can be removed, and left in its place is a support layer, comprised by the material 108, with the discrete hollow conduits 110, of FIG. 8, formed within and over the electrical contacts 104 by the honeycomb meshwork of posts 304.

Per this embodiment, the material 108 encases the semiconductor die 106 but deposits less of the material 108 over the contact regions 802, of FIG. 8. By depositing less of the material 108 over the contact regions 802, the aspect ratio of the discrete hollow conduits 110 is decreased while maintaining the support provided by the material 108 to the substrate 102. Although not intended to limit the scope of the present invention, some aspects provided by the stepped configuration include reduced material costs and decreased reflow distance of an electrical connection formed within the discrete hollow conduit 110, of FIG. 8.

In at least one embodiment, the length of the honeycomb meshwork of posts 304 for the mold plate 2300, of FIG. 23, can be reduced by about ten percent (10%) to about ninety percent (90%) for the honeycomb meshwork of posts 304 for the mold plate 2500 to help achieve the stepped configuration.

Figure 26:
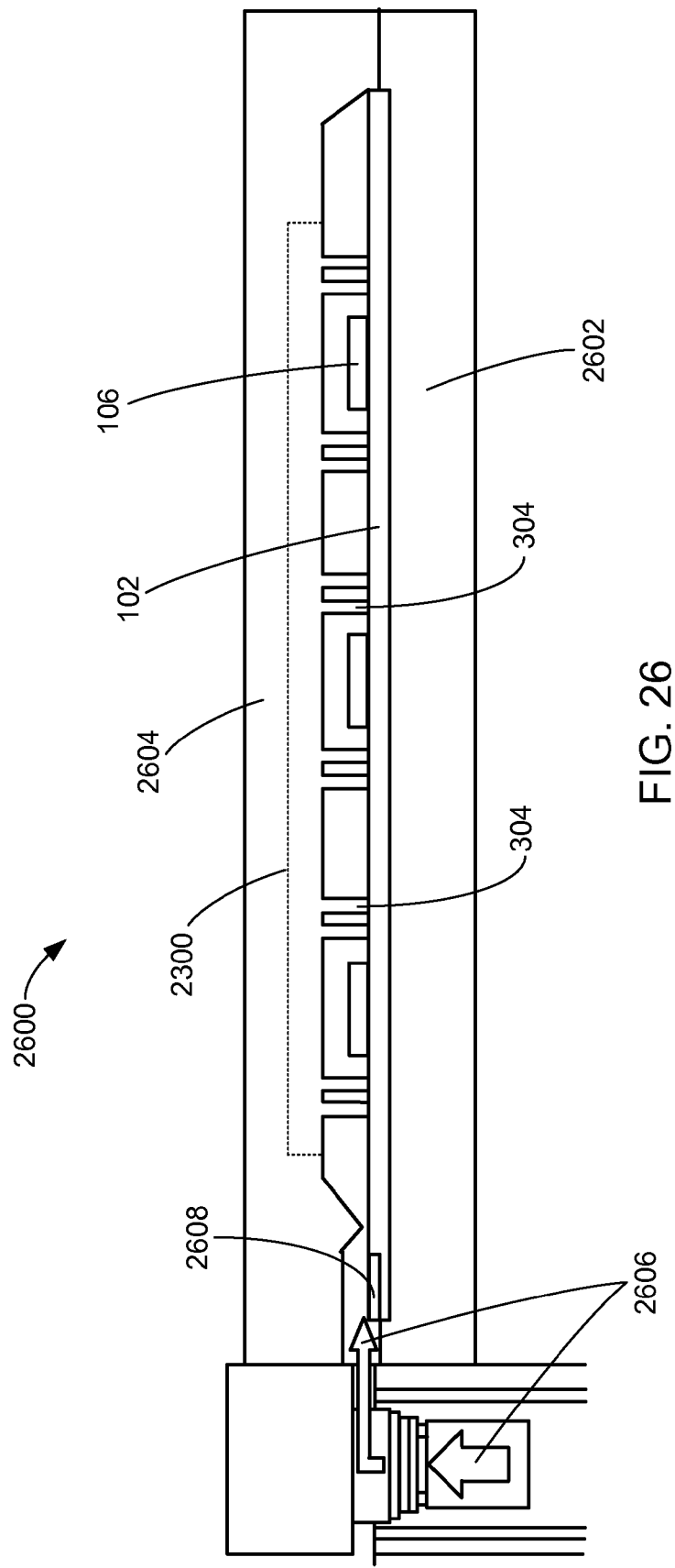
FIG. 26 is a cross sectional view of a mold system in accordance with the embodiments of FIGS. 23-25.

Referring now to FIG. 26, therein is shown a cross sectional view of a mold system 2600 in accordance with the embodiments of FIGS. 23-25. The mold system 2600 includes a bottom mold plate 2602, a top mold plate 2604, a mold flow passage 2606, a de-gate structure 2608, the mold plate 2300 depicted partially in dashed outline, the substrate 102 and the semiconductor die 106. The material 108, of FIG. 1, can flow through the mold flow passage 2606 and enter adjacent the semiconductor die 106 and flow around the honeycomb meshwork of posts 304. The designs of the honeycomb meshwork of posts 304 and the substrate 102 are such that when mated together a secure contact occurs at the interface between the honeycomb meshwork of posts 304 and a surface of the substrate 102.

In at least one embodiment, the mold plate 2300 and the top mold plate 2604 can be formed as a single integral unit.

It will be appreciated by those skilled in the art that the bottom mold plate 2602 may include one or more of a location pin protruding upwards towards the top mold plate 2604, wherein the substrate 102 includes a corresponding location pin hole that enables the substrate 102 to slide down over the location pin, thereby holding the substrate 102 firmly in place. Generally, the location pin hole of the substrate 102 can be formed partially or all the way through the substrate 102. Typically, the location pin hole can be formed along the perimeter of the substrate 102, in non-active areas of the substrate 102, or adjacent the de-gate structure 2608; however, it is to be understood that other locations are possible.

Additionally, it will be appreciated by those skilled in the art that a sidewall along the interior of the top mold plate 2604 or the bottom mold plate 2602 can be formed adjacent or in direct contact with the perimeter of the substrate 102, thereby holding the substrate 102 firmly in place. In another embodiment, the substrate 102 can be held firmly in place by setting the substrate 102 within a recess formed within the bottom mold plate 2602.

It will appreciated by those skilled in the art that the affinity between the material 108 and the substrate 102 can make removal of the material 108 difficult. Accordingly, the inventors have discovered that the de-gate structure 2608 can be help to remove unwanted portions of the material 108 from the substrate 102. In at least one embodiment, the de-gate structure 2608 can be a portion of the substrate 102 that detaches easily from unnecessary portions of the material 108 after the material 108 has partially or fully cured. In such cases, the de-gate structure 2608 may include a metal formed within or directly on the substrate 102.

Figure 27:
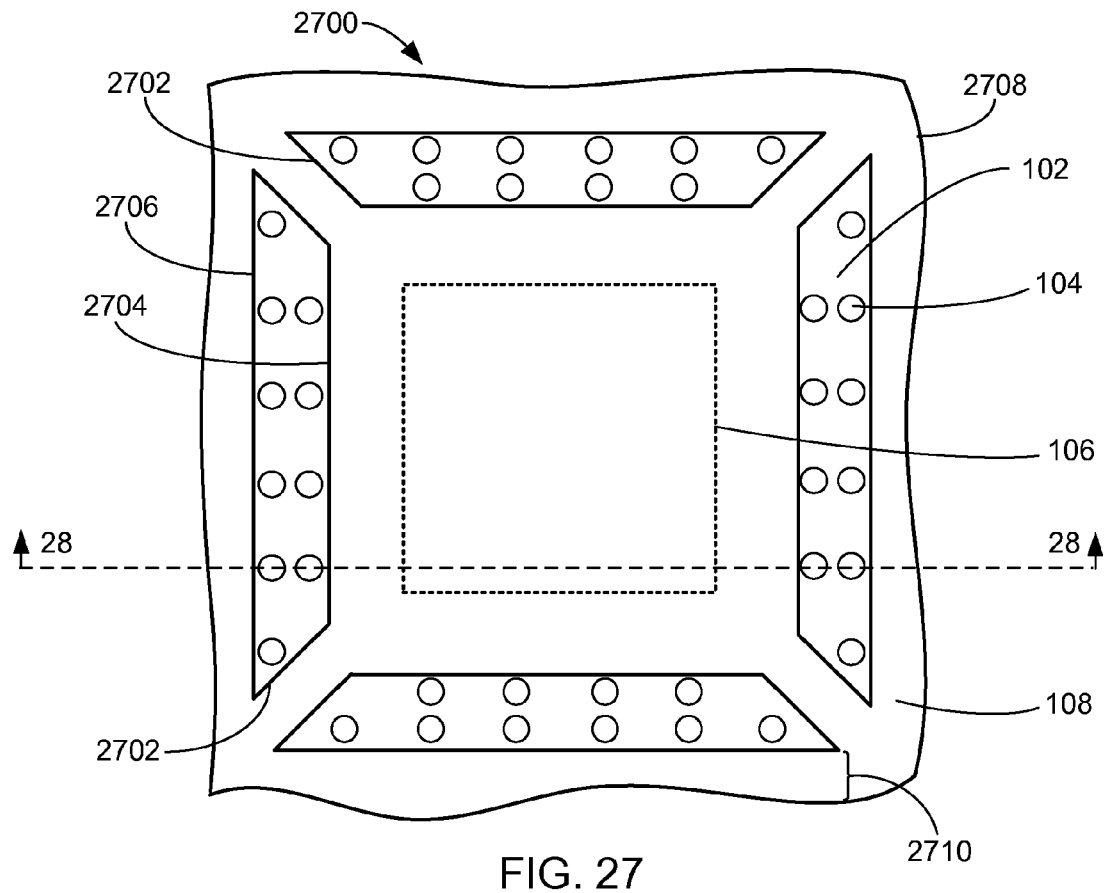
FIG. 27 is a top view of an integrated circuit package system in accordance with another embodiment of the present invention.

Referring now to FIG. 27, therein is shown a top view of an integrated circuit package system 2700 in accordance with another embodiment of the present invention. The integrated circuit package system 2700 includes the substrate 102, the electrical contacts 104, the semiconductor die 106, the material 108, and a block conduit 2702. Generally, the block conduit 2702 may expose one or more of the electrical contacts 104 formed on a side of the semiconductor die 106. In at least one embodiment, the block conduit 2702 may include a trapezoidal shape with a short side 2704 located adjacent the semiconductor die 106 and a long side 2706 located adjacent a perimeter 2708 of the integrated circuit package system 2700.

Per the present embodiment, there are four (4) of the block conduit 2702, with one of the block conduit 2702 formed with each corresponding side of the semiconductor die 106, thereby and exposing more than one of the electrical contacts 104 per side. However, it is to be understood that the block conduit 2702 of the current embodiment is not limited to the preceding example. In accordance with the present embodiments, the block conduit 2702 configuration may include any number, size or shape of the block conduit 2702 for permitting access to the electrical contacts 104 formed within the material 108.

Figure 29:
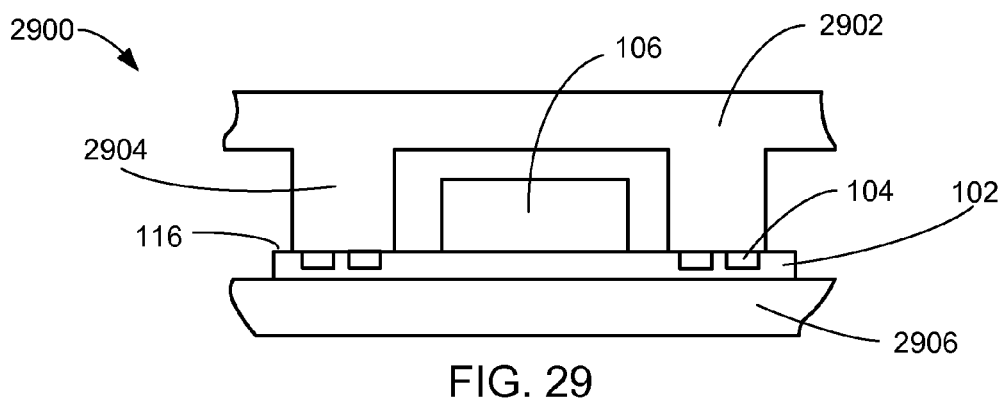
FIG. 29 is a side view of a mold plate in accordance with an embodiment of the present invention.

It will be appreciated by those skilled in the art that the block conduits 2702 within the material 108 can be formed by a corresponding structure, such as a protruding block 2904, of FIG. 29.

Generally, the integrated circuit package system 2700 may include an outer mold cap ring 2710 formed between the outer portion (e.g., the long side 2706) of the block conduit 2702 and the perimeter 2708 of the integrated circuit package system 2700. It has been discovered by the present inventors that the outer mold cap ring 2710 may provide a reinforcement/stiffener type structure that helps to prevent warpage of the integrated circuit package system 2700. By preventing the warpage so common to packages, the electrical pathways between adjacent substrates can be enhanced and the incidence of device or package malfunction, due to failed interconnections, can be prevented.

Additionally, it has been discovered by the present inventors that forming the block conduit 2702 helps to alleviate the tighter dimension control required of the honeycomb meshwork of posts 304, of FIG. 23 for example, during mold chaser fabrication. By easing the dimension control required to manufacture the mold chase with the block conduit 2702, the cost to produce each unit can be reduced. Furthermore, it has been discovered that a method and/or device manufactured by the block conduit 2702 permits an easing of the molding process control by providing a wider tolerance for the mold chaser alignment. For example, aligning individual posts to each individual contact pad can require tighter process control than aligning more than one of the contact pads with a single one of a protruding block 2904 via a single alignment step.

Additionally, it is to be understood that the relative location of each of the block conduit 2702 with regards to the other of the block conduit 2702 can be purposefully configured and/or designed to permit the formation of mold pathways, such as the mold traces 1702 of FIG. 17, between the block conduit 2702. It will be appreciated by those skilled in the art that the relative configuration of the block conduits 2702 can be manipulated to increase or decrease the size of the mold traces 1702, thereby modulating (e.g., easing or restricting) the flow of the material 108 (not shown) between the block conduit 2702.

Figure 28:
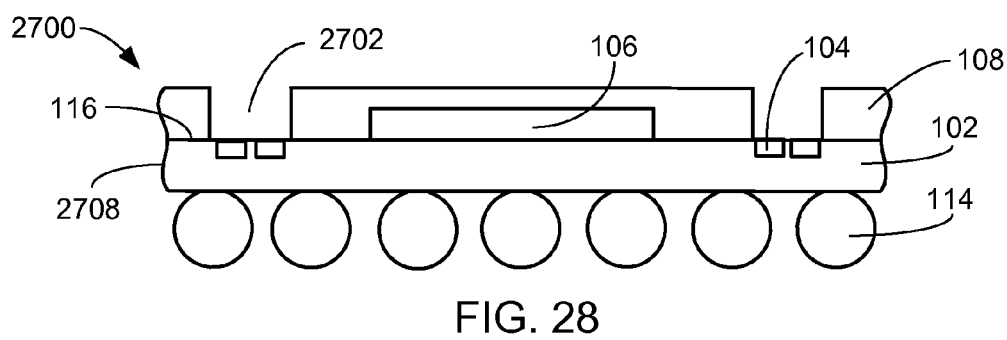
FIG. 28 is a cross sectional view of an integrated circuit package system of FIG. 27 taken along line 28-28.

Referring now to FIG. 28, therein is shown a cross sectional view of the integrated circuit package system 2700 of FIG. 27 taken along line 28-28. The integrated circuit package system 2700, such as a bottom package, may include the substrate 102, the electrical contacts 104, the semiconductor die 106, the material 108, the block conduits 2702, the external electrical connections 114, the top surface 116, and the perimeter 2708. In at least one embodiment, the integrated circuit package system 2700 may include two rows of the electrical contacts 104 formed within the block conduit 2702. However, it is to be understood that the number of rows of the electrical contacts 104 depicted is exemplary and that one or more rows of the electrical contacts 104 can be formed depending upon the design specifications of the integrated circuit package system 2700.

It will be appreciated by those skilled in the art that the integrated circuit package system 2700 formed by the current embodiments may be employed within a package-on-package configuration or a package-in-package configuration.

Referring now to FIG. 29, therein is shown a side view of a mold plate 2900 in accordance with an embodiment of the present invention. The mold plate 2900 includes a mold chaser 2902, the protruding block 2904, a bottom mold 2906, the substrate 102, and the semiconductor die 106. In at least one embodiment, only the protruding block 2904 directly contacts the top surface 116 of the substrate 102. In such cases, the protruding block 2904 can be formed over the electrical contacts 104. Additionally, it is to be understood that the mold plate 2900 may include a structure capable of defining the boundaries of any encapsulant or underfill.

Generally, the protruding block 2904 and the top surface 116 of the substrate 102 can be adapted for cooperative engagement, thereby creating a void space defined by the block conduit 2702, of FIG. 27. The designs of the protruding block 2904 and the substrate 102 are such that when mated together a secure contact occurs at the interface between the protruding block 2904 and the top surface 116 of the substrate 102. Per this invention, a secure contact can be defined as the amount of contact force necessary between adjacent surfaces that prevents processing failures due to separation of the surfaces during manufacturing operations. By way of example, the secure contact of the present invention helps to ensure that the material 108, of FIG. 27, does not leak between the protruding block 2904 and the substrate 102 into the area defined by the block conduit 2702.

It will be appreciated by those skilled in the art that the protruding block 2904 can be utilized within the top center gate mold system 200, of FIG. 2, or the side mold system 400, of FIG. 4, for example. It has been discovered by the present inventors that the mold chaser 2902 employing the protruding block 2904 formation enables a wider range of contact forces to be exerted on the mold chaser 2902 because the concerns of individual post deformation can be eliminated. Consequently, the larger structure of the protruding block 2904 as compared to the honeycomb meshwork of posts 304, of FIG. 19 for example, permits a wider range of contact forces, thereby reducing the occurrence of mold flash and the likelihood of contamination of the contact pads.

It will be appreciated by those skilled in the art that the bottom mold 2906 may include one or more of an location pin protruding upwards towards the mold chaser 2902, wherein the substrate 102 includes a corresponding location pin hole that enables the substrate 102 to slide down over the location pin, thereby holding the substrate 102 firmly in place. Generally, the location pin hole of the substrate 102 can be formed partially or all the way through the substrate 102. Typically, the location pin hole can be formed along the perimeter of the substrate 102, in non-active areas of the substrate 102, or adjacent the de-gate structure 2608 (of FIG. 26); however, it is to be understood that other locations are possible.

Additionally, it will be appreciated by those skilled in the art that a sidewall along the interior of the mold chaser 2902 or the bottom mold 2906 can be formed adjacent or in direct contact with the perimeter of the substrate 102, thereby holding the substrate 102 firmly in place. In another embodiment, the substrate 102 can be held firmly in place by setting the substrate 102 within a recess formed within the bottom mold 2906.

Figure 30:
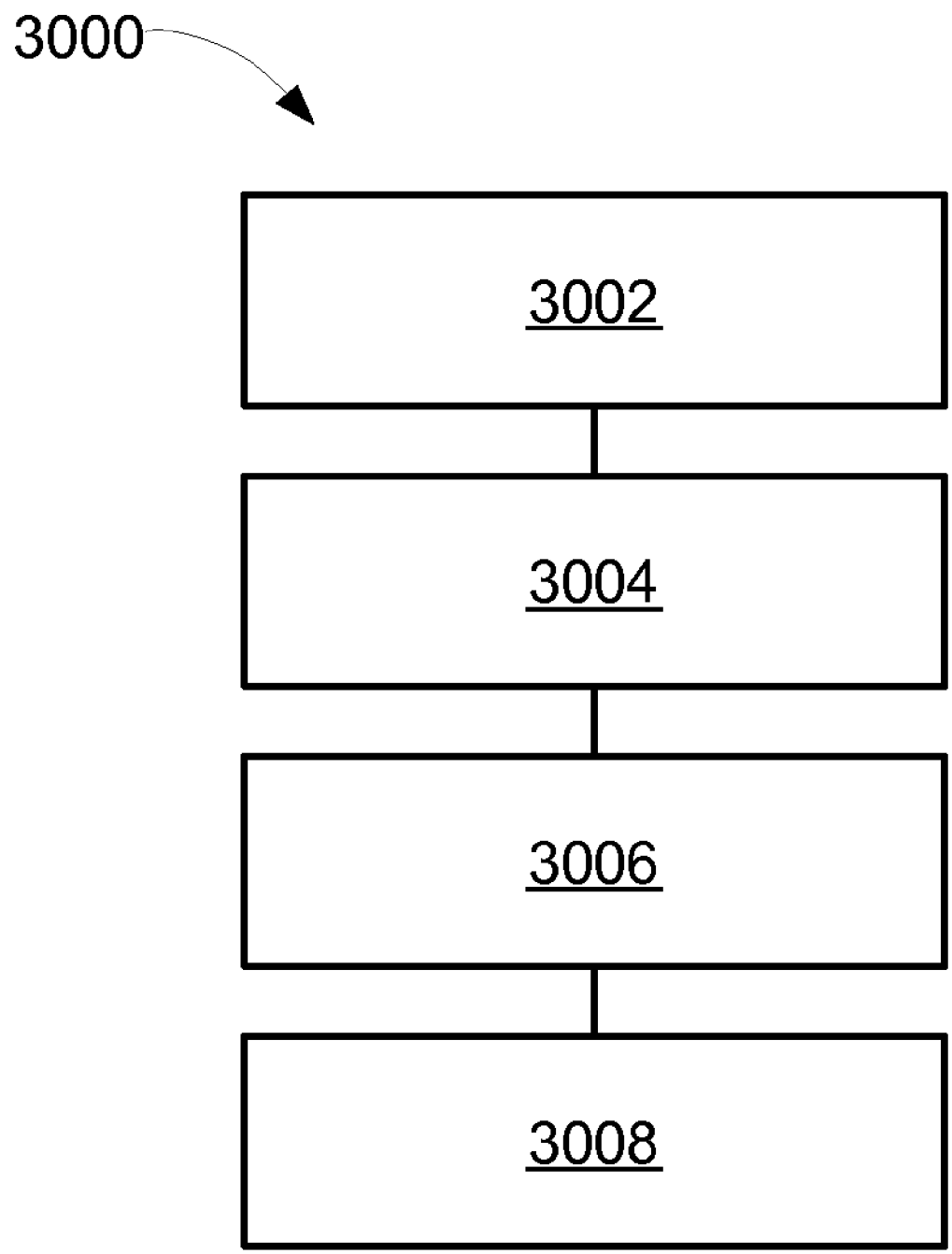
FIG. 30 is a flow chart of a method of manufacture of the integrated circuit package system in accordance with an embodiment of the present invention.

Referring now to FIG. 30, therein is shown a flow chart of a method 3000 of manufacture of the integrated circuit package system 600 in accordance with an embodiment of the present invention. The method 3000 includes: providing a substrate with a top surface in a block 3002; configuring the top surface to include electrical contacts and an integrated circuit in a block 3004; providing a structure over the substrate with only a honeycomb meshwork of posts contacting the top surface of the substrate in a block 3006; and depositing a material to prevent warpage of the substrate on the top surface of the substrate and over the integrated circuit, the material patterned to have discrete hollow conduits that expose the electrical contacts in a block 3008.

It has been discovered that the present invention thus has numerous aspects. An aspect of the present invention is that it provides structural integrity to a substrate incorporated into a stacked package structure, such as, PoP and PiP. By providing structural support to a substrate, warping of the substrate can be prevented during later processing steps.

Another aspect of the present invention is that by forming a protruding block structure for blocking the flow of material, looser dimension and molding process control parameters can be employed.

Another aspect of the present invention is the prevention of failed interconnects due to warping of the substrate. By preventing warpage, the electrical pathways between adjacent substrates can be enhanced and the incidence of device or package malfunction, due to failed interconnects, can be prevented.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects. For instance, by providing a process that lends structural support to substrates and packages through a material including a honeycomb meshwork of discrete hollow conduits, the quality and integrity of interconnects between adjacent substrates and packages can be enhanced. The resulting processes and configurations are straightforward, cost-effective, uncomplicated, highly versatile and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
providing a substrate with a top surface;
configuring the top surface to include electrical contacts and an integrated circuit;
providing a structure over the substrate with only a honeycomb meshwork of posts contacting the top surface of the substrate; and
depositing a material to prevent warpage of the substrate on the top surface of the substrate and over the integrated circuit, the material patterned to have discrete hollow conduits exposing the electrical contacts.

2. The method as claimed in claim 1 further comprising:
configuring each of the discrete hollow conduits for receiving an electrical connection.

3. The method as claimed in claim 1 further comprising:
forming an electrical connection within the discrete hollow conduits contacting the electrical contacts.

4. The method as claimed in claim 1 further comprising:
forming a de-gate structure on the substrate.

5. The method as claimed in claim 1 further comprising:
configuring the structure to include two or more of a unit cell.

6. The method as claimed in claim 1 wherein:
configuring the top surface to include an integrated circuit includes providing two or more of the integrated circuits; and
depositing the material includes depositing via a side mold system.

7. The method as claimed in claim 6 further comprising:
configuring the discrete hollow conduits to include a stepped configuration.

8. The method as claimed in claim 6 further comprising:
forming external electrical connections on a bottom surface of the substrate.

9. The method as claimed in claim 6 further comprising:
configuring the integrated circuit package system to include a package-on-package configuration or a package-in-package configuration.

10. The method as claimed in claim 6 further comprising:
configuring the discrete hollow conduits to be larger than the electrical contacts.

11. A method of manufacture of an integrated circuit package system comprising:
providing a substrate with a top surface;
configuring the top surface to include electrical contacts and an integrated circuit;
providing a structure over the substrate with only a protruding block contacting the top surface of the substrate; and
depositing a material to prevent warpage of the substrate on the top surface of the substrate and over the integrated circuit, the material patterned to have a block conduit exposing the electrical contacts.

12. The method as claimed in claim 11 further comprising:
configuring each of the block conduits to include two or more rows of the electrical contacts.

13. The method as claimed in claim 11 further comprising:
forming an electrical connection within the block conduits contacting the electrical contacts.

14. The method as claimed in claim 11 further comprising:
forming a de-gate structure on the substrate.

15. The method as claimed in claim 11 further comprising:
configuring the protruding block to include a trapezoidal shape.

16. The method as claimed in claim 11 further comprising:
forming two or more of the protruding block around the integrated circuit.

17. The method as claimed in claim 16 further comprising:
configuring the protruding blocks to form mold pathways.

18. The method as claimed in claim 16 wherein:
forming external electrical connections on a bottom surface of the substrate.

19. The method as claimed in claim 16 further comprising:
configuring the integrated circuit package system to include a package-on-package configuration or a package-in-package configuration.

20. The method as claimed in claim 16 further comprising:
forming an outer mold cap ring for support.

* * * * *